(12) United States Patent
Champoux et al.

(10) Patent No.: US 12,055,581 B2
(45) Date of Patent: *Aug. 6, 2024

(54) SOFTWARE DIRECTED FIRMWARE ACCELERATION

(71) Applicant: Advantest Corporation, Tokyo (JP)

(72) Inventors: Duane Champoux, San Jose, CA (US); Linden Hsu, San Jose, CA (US); Srdjan Malisic, San Jose, CA (US); Mei-Mei Su, San Jose, CA (US)

(73) Assignee: Advantest Corporation, Tokyo (JP)

( * ) Notice: Subject to any disclaimer, the term of this patent is extended or adjusted under 35 U.S.C. 154(b) by 52 days.

This patent is subject to a terminal disclaimer.

(21) Appl. No.: 17/135,731

(22) Filed: Dec. 28, 2020

(65) Prior Publication Data
US 2021/0116494 A1 Apr. 22, 2021

Related U.S. Application Data

(63) Continuation-in-part of application No. 15/914,553, filed on Mar. 7, 2018, now Pat. No. 11,009,550, (Continued)

(51) Int. Cl.
G01R 31/28 (2006.01)
G06F 13/42 (2006.01)
G11C 29/08 (2006.01)

(52) U.S. Cl.
CPC ..... *G01R 31/2834* (2013.01); *G06F 13/4282* (2013.01); *G11C 29/08* (2013.01);
(Continued)

(58) Field of Classification Search
CPC .......... G01R 31/2601; G01R 31/31903; G06F 11/263
See application file for complete search history.

(56) References Cited

U.S. PATENT DOCUMENTS 7,496,820 B1   2/2009  Theron et al.
7,930,162 B1 * 4/2011  Chan ..................... G06F 30/331
                                                  714/724
(Continued)

FOREIGN PATENT DOCUMENTS

CN   113127385 A  *  7/2021  ............. G06F 3/061
TW   201433804 A     9/2014
(Continued)

*Primary Examiner* — Michael J Dalbo

(57) ABSTRACT

A method for testing using an automated test equipment (ATE) comprises transmitting instructions for executing tests on a device under test (DUT) from a tester processor to a queue communicatively coupled with the tester processor and a Field Programmable Gate Array (FPGA), wherein the tester processor is configured to determine a hardware acceleration mode from a plurality of hardware acceleration modes for executing tests on the DUT. Further, the hardware acceleration mode is configured to distribute functionality for generating commands and data between the tester processor and the FPGA, wherein in at least one hardware acceleration mode the tester processor is configured to generate commands for testing the DUT and the FPGA is configured to generate data for testing the DUT. The method also comprises accessing the instructions in the queue, translating the instructions into commands associated with testing the DUT and transmitting the commands to the DUT.

16 Claims, 13 Drawing Sheets

Related U.S. Application Data which is a continuation-in-part of application No. 13/773,569, filed on Feb. 21, 2013, now Pat. No. 10,162,007.

(52) U.S. Cl.
CPC .............. *G06F 2213/0026* (2013.01); *G06F 2213/0028* (2013.01); *G06F 2213/0032* (2013.01); *G06F 2213/0042* (2013.01)

(56) References Cited

U.S. PATENT DOCUMENTS

| | | |
|---|---|---|
| 9,116,785 B2 | 8/2015 | Ferry |
| 9,164,859 B2 | 10/2015 | Rivera Trevino et al. |
| 9,952,276 B2 * | 4/2018 | Frediani ............ G01R 31/2834 |
| 10,161,993 B2 * | 12/2018 | Frediani ............ G01R 31/2834 |
| 10,162,007 B2 * | 12/2018 | Chan ................ G01R 31/31919 |
| 10,163,525 B2 | 12/2018 | Yun et al. |
| 10,288,681 B2 * | 5/2019 | Champoux ...... G01R 31/31908 |
| 10,976,361 B2 * | 4/2021 | Malisic ................. G01R 1/025 |
| 11,009,550 B2 * | 5/2021 | Champoux ...... G01R 31/31907 |
| 2011/0145645 A1 * | 6/2011 | Volkerink ........ G01R 31/31903 |
| | | 714/E11.02 |
| 2011/0161041 A1 * | 6/2011 | Hiraide ............ G01R 31/31907 |
| | | 702/122 |
| 2012/0331343 A1 * | 12/2012 | Norton .......... G01R 31/318371 |
| | | 714/25 |
| 2018/0267101 A1 * | 9/2018 | Champoux ............ G01R 35/00 |
| 2019/0392825 A1 * | 12/2019 | Christopher ............ G06F 3/167 |
| 2020/0033405 A1 | 1/2020 | Chan et al. |
| 2020/0033409 A1 | 1/2020 | Hobbs et al. |

FOREIGN PATENT DOCUMENTS

| | | | |
|---|---|---|---|
| TW | 201706862 A | 2/2017 | |
| WO | WO-2011149725 A2 * | 12/2011 | ......... G01R 31/2834 |

* cited by examiner

SOFTWARE DIRECTED FIRMWARE ACCELERATION

CROSS-REFERENCE TO RELATED APPLICATIONS

The present application is a continuation-in-part of U.S. patent application Ser. No. 15/914,553, filed Mar. 7, 2018, entitled "A TEST ARCHITECTURE WITH A FPGA BASED TEST BOARD TO SIMULATE A DUT OR END-POINT," naming Duane Champoux and Mei-Mei Su as inventors, which is a continuation-in-part of U.S. patent application Ser. No. 13/773,569, filed Feb. 21, 2013, entitled "A TEST ARCHITECTURE HAVING MULTIPLE FPGA BASED HARDWARE ACCELERATOR BLOCKS FOR TESTING MULTIPLE DUTS INDEPENDENTLY," naming Gerald Chan, Eric Kushnick, Mei-Mei Su and Andrew Niemic as inventors. Both applications are incorporated herein by reference in their entirety and for all purposes.

FIELD OF THE INVENTION

The present disclosure relates generally to the field of electronic device testing systems and more specifically to the field of electronic device testing equipment for testing devices under test (DUTs).

BACKGROUND OF THE INVENTION

Automated test equipment (ATE) can be any testing assembly that performs a test on a semiconductor device or electronic assembly. ATE assemblies may be used to execute automated tests that quickly perform measurements and generate test results that can then be analyzed. An ATE assembly may be anything from a computer system coupled to a meter, to a complicated automated test assembly that may include a custom, dedicated computer control system and many different test instruments that are capable of automatically testing electronics parts and/or semiconductor wafer testing, such as system-on-chip (SOC) testing or integrated circuit testing. ATE systems both reduce the amount of time spent on testing devices to ensure that the device functions as designed and serve as a diagnostic tool to determine the presence of faulty components within a given device before it reaches the consumer.

FIG. 1 is a schematic block diagram of a conventional automatic test equipment body 100 for testing certain typical DUTs e.g. a semiconductor memory device such as a DRAM. The ATE includes an ATE body 100 with hardware bus adapter sockets 110A-110N. Hardware bus adapter cards 110A-110N specific to a particular communication protocol e.g. PCIe, USB, SATA, SAS etc. connect to the hardware bus adapter sockets provided on the ATE body and interface with the DUTs via cables specific to the respective protocol. The ATE body 100 also includes a tester processor 101 with an associated memory 108 to control the hardware components built into the ATE body 100 and to generate the commands and data necessary to communicate with the DUTs being tested through the hardware bus adapter cards. The tester processor 101 communicates with the hardware bus adapter cards over system bus 130. The tester processor may be programmed to include certain functional blocks including a pattern generator 102 and a comparator 106. Alternatively, the pattern generator 102 and comparator 106 may be hardware components mounted on an expansion or adapter card that plug into the ATE body 100.

The ATE body 100 tests the electrical functions of the DUTs 112A-112N connected to the ATE body 100 through hardware bus adapters plugged into the hardware bus adapter sockets of the ATE body 100. Accordingly, the tester processor 101 is programmed to communicate the test programs needed to be run to the DUTs using the protocol unique to the hardware bus adapters. Meanwhile, the other hardware components built into the ATE body 100 communicate signals with each other and with the DUTs according to test programs operating in the tester processor 101.

The test program run by the tester processor 101 may include a function test which involves writing input signals created by the pattern generator 102 to the DUTs, reading out the written signals from the DUTs and using the comparator 106 to compare the output with the expected patterns. If the output does not match the input, the tester processor 101 will identify the DUT as being defective. For example, if the DUT is a memory device such as a DRAM, the test program will write data generated by the pattern generator 102 to the DUT using a Write Operation, read data from the DRAM using a Read Operation and compare the expected bit pattern with the read pattern using the comparator 106.

In conventional systems, the tester processor 101 needs to contain the functional logic blocks to generate the commands and test patterns used in testing the DUTs, such as the pattern generator 102 and the comparator 106, programmed in software directly on the processor. However, in some instances certain functional blocks such as the comparator 106 may be implemented on a field programmable gate array (FPGA), which is an application specific integrated circuit (ASIC) type semiconductor device that can program logic circuits according to a user's demand.

The FPGAs used in conventional systems rely on the tester processor 101 to transfer the commands and test patterns to the FPGA, which the FPGA in turn relays over to the DUTs. Because the tester processor, and not the FPGA, is responsible for generating the commands and test patterns, the number and type of DUTs that can be tested with a given ATE body is limited by the processing capabilities and programming of the tester processor. Where the tester processor generates all the commands and test patterns, bandwidth constraints on the system bus 130 connecting the tester processor to the various hardware components, including any FPGA devices and hardware bus adapter sockets, also places an upper limit on the number of DUTs that can tested simultaneously.

Also, in conventional systems, the communication protocol used to communicate with the DUTs is fixed because the hardware bus adapter cards that plug into the ATE body 100 are single purpose devices that are designed to communicate in only one protocol and cannot be reprogrammed to communicate in a different protocol. For example, an ATE body configured to test PCIe devices will have hardware bus adapter cards plugged into the body that support only the PCIe protocol. In order to test DUTs supporting a different protocol, e.g., SATA the user would ordinarily need to replace the PCIe hardware bus adapter cards with bus adapter cards supporting the SATA protocol. Unless the PCIe hardware bus adapter cards are physically substituted with cards supporting the other protocol, such a system can only test DUTs that support the PCIe protocol. Thus, on the test floor, critical time is consumed replacing hardware bus adapter cards when DUTs running a different protocol from the one that the existing adapter cards support need to be tested.

Another drawback of conventional tester systems is that because the tester processor is generating all the commands and test patterns, the firmware of the tester system, e.g., any FPGAs in the system are not being utilized to their full capacity. The tester processor acts as a bottleneck in the system, thereby, preventing the FPGA from operating at its maximal processing speed.

BRIEF SUMMARY OF THE INVENTION

Accordingly, a need exists for a tester architecture that can address the problems with the systems described above. What is needed is a test architecture whereby the command and/or test pattern generation functionality can be transferred onto the FPGA, so that the processing load on the tester processor and the bandwidth requirements on the system bus can be maintained at a minimum. This would be more efficient than prior configurations where the tester processor bore the entire processing load and the system bus conveyed test data and commands for all the DUTs connected to the ATE body. Further, what is needed is a test architecture whereby the communicative protocol engine can be programmed on FPGA devices so that the protocol used to communicate with the DUTs is reconfigurable.

Additionally, what is needed is a test architecture that reduces the instances of the tester processor being a bottleneck and allows the FPGA and DUTs in the tester system to be fully utilized. In other words, what is needed is a test architecture that allows the tester processor and the FPGA to work symbiotically at optimal speed in order to prevent DUTs from being under-utilized. By making commands for the DUTs available to the FPGA in a buffer, the FPGA is able to process the commands as bandwidth frees up in the DUTs and does not need to wait for the tester processor.

In one embodiment, a method for testing using an automated test equipment (ATE) comprises transmitting instructions for executing tests on a device under test (DUT) from a tester processor to a queue communicatively coupled with the tester processor and a Field Programmable Gate Array (FPGA), wherein the tester processor is configured to determine a hardware acceleration mode from a plurality of hardware acceleration modes for executing tests on the DUT. Further, the hardware acceleration mode is configured to distribute functionality for generating commands and data between the tester processor and the FPGA, wherein in at least one hardware acceleration mode the tester processor is configured to generate commands for testing the DUT and the FPGA is configured to generate data for testing the DUT. The method also comprises accessing the instructions in the queue, translating the instructions into commands associated with testing the DUT and transmitting the commands to the DUT.

In another embodiment, an automated test equipment (ATE) apparatus is disclosed. The apparatus comprises a tester processor configured to determine a hardware acceleration mode selected from a plurality of hardware acceleration modes for executing tests on a device under test (DUT) wherein each of the plurality of hardware acceleration modes is configured to distribute functionality for generating commands and data between the tester processor and an FPGA. The apparatus also comprises the Field Programmable Gate Array (FPGA) communicatively coupled to the tester processor, wherein at least one hardware acceleration comprises a software directed firmware acceleration mode, and wherein in the software directed firmware acceleration mode the tester processor is configured to generate instructions for testing the DUT and the FPGA is configured to generate data for testing the DUT. Further, the apparatus comprises a queue communicatively coupled to the tester processor and the FPGA, wherein the queue is operable to receive the instructions generated by the tester processor and buffer the instructions until the FPGA accesses the instructions from the queue. In normal operation, the queue contains instructions for the FPGA when the FPGA requires a new instruction, thereby, keeping the FPGA substantially always busy.

In a different embodiment, an automated test equipment (ATE) system comprises a system controller communicatively coupled to a tester processor, wherein the system controller is operable to transmit instructions for performing an automated test to the tester processor. The apparatus also comprises a Field Programmable Gate Array (FPGA) coupled to the tester processor, wherein the tester processor is configured to determine a hardware acceleration mode selected from a plurality of hardware acceleration modes for executing tests on a device under test (DUT) in accordance with instructions received from the system controller, wherein each of the plurality of hardware acceleration modes is configured to distribute functionality for generating commands and data between the tester processor and the FPGA, and wherein in at least one hardware acceleration mode the tester processor is configured to generate commands for testing the DUT and the FPGA is configured to generate data for testing the DUT. Further, the apparatus comprises a queue communicatively coupled to the tester processor and the FPGA, wherein the queue is operable to receive commands generated by the tester processor and buffer the commands until the FPGA accesses the commands from the queue.

The following detailed description together with the accompanying drawings will provide a better understanding of the nature and advantages of the present invention.

BRIEF DESCRIPTION OF THE DRAWINGS

Embodiments of the present invention are illustrated by way of example, and not by way of limitation, in the figures of the accompanying drawings and in which like reference numerals refer to similar elements.

Figure 1:
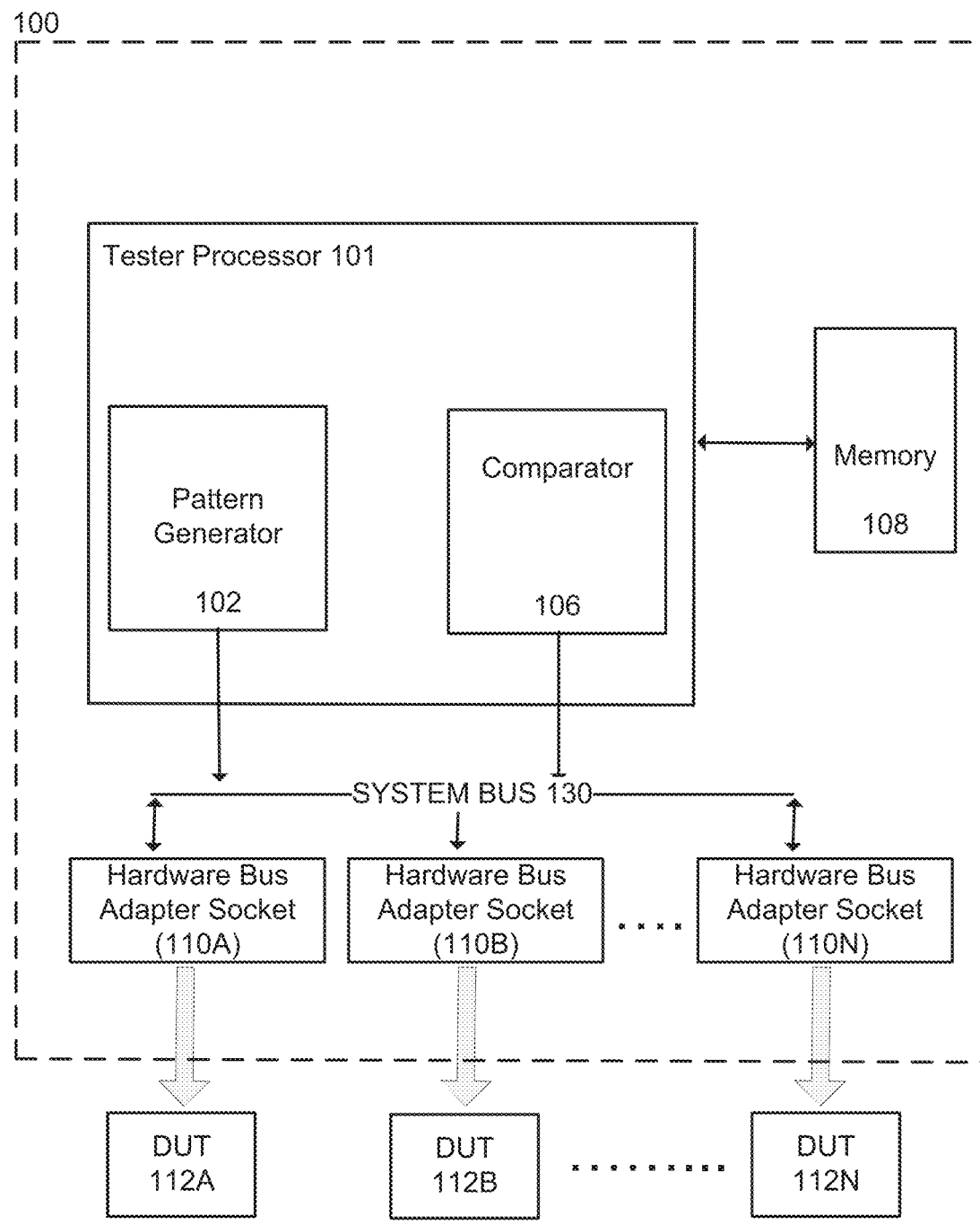
FIG. 1 is a schematic block diagram of a conventional automatic test equipment body for testing a typical device under test (DUT).

In the figures, elements having the same designation have the same or similar function.

DETAILED DESCRIPTION OF THE INVENTION

Reference will now be made in detail to embodiments, examples of which are illustrated in the accompanying drawings. While the embodiments will be described in conjunction with the drawings, it will be understood that they are not intended to limit the embodiments. On the contrary, the embodiments are intended to cover alternatives, modifications and equivalents. Furthermore, in the following detailed description, numerous specific details are set forth in order to provide a thorough understanding. However, it will be recognized by one of ordinary skill in the art that the embodiments may be practiced without these specific details. In other instances, well-known methods, procedures, components, and circuits have not been described in detail as not to unnecessarily obscure aspects of the embodiments.

Notation and Nomenclature Section

Some regions of the detailed descriptions which follow are presented in terms of procedures, logic blocks, processing and other symbolic representations of operations on data bits within a computer memory. These descriptions and representations are the means used by those skilled in the data processing arts to most effectively convey the substance of their work to others skilled in the art. In the present application, a procedure, logic block, process, or the like, is conceived to be a self-consistent sequence of steps or instructions leading to a desired result. The steps are those requiring physical manipulations of physical quantities. Usually, although not necessarily, these quantities take the form of electrical or magnetic signals capable of being stored, transferred, combined, compared, and otherwise manipulated in a computer system.

It should be borne in mind, however, that all of these and similar terms are to be associated with the appropriate physical quantities and are merely convenient labels applied to these quantities. Unless specifically stated otherwise as apparent from the following discussions, it is appreciated that throughout the present invention, discussions utilizing the terms such as "generating," "communicating," "comparing," "flagging," "reading," "writing," "transmitting," "initiating," or the like, refer to the action and processes of a computer system, or similar electronic computing device, that manipulates and transforms data represented as physical (electronic) quantities within the computer system's registers and memories into other data similarly represented as physical quantities within the computer system memories or registers or other such information storage, transmission or display devices.

The description below provides a discussion of computers and other devices that may include one or more modules. As used herein, the term "module" or "block" may be understood to refer to software, firmware, hardware, and/or various combinations thereof. It is noted that the blocks and modules are exemplary. The blocks or modules may be combined, integrated, separated, and/or duplicated to support various applications. Also, a function described herein as being performed at a particular module or block may be performed at one or more other modules or blocks and/or by one or more other devices instead of or in addition to the function performed at the described particular module or block. Further, the modules or blocks may be implemented across multiple devices and/or other components local or remote to one another. Additionally, the modules or blocks may be moved from one device and added to another device, and/or may be included in both devices. Any software implementations of the present invention may be tangibly embodied in one or more storage media, such as, for example, a memory device, a floppy disk, a compact disk (CD), a digital versatile disk (DVD), or other devices that may store computer code.

The terminology used herein is for the purpose of describing particular embodiments only and is not intended to limit the scope of the present invention. As used throughout this disclosure, the singular forms "a," "an," and "the" include plural reference unless the context clearly dictates otherwise. Thus, for example, a reference to "a module" includes a plurality of such modules, as well as a single module, and equivalents thereof known to those skilled in the art.

I. A Test Architecture having Multiple FPGA Based Hardware Accelerator Blocks for Testing Multiple DUTs Independently Test throughput can be usually be improved in a number of ways. One way to decrease the testing time of DUTs is by transferring functionality formerly performed in software on a general-purpose tester processor to hardware accelerators implemented on FPGA devices. Another way is by increasing the number and types of devices under test (DUTs) that can be tested under prevailing hardware and time constraints, for example, by configuring the hardware so that DUTs supporting many different types of protocols can be tested with the same hardware without needing to replace or substitute any hardware components. Embodiments of the present invention are directed to so improving test efficiency in the hardware of the automatic test equipment.

Figure 2:
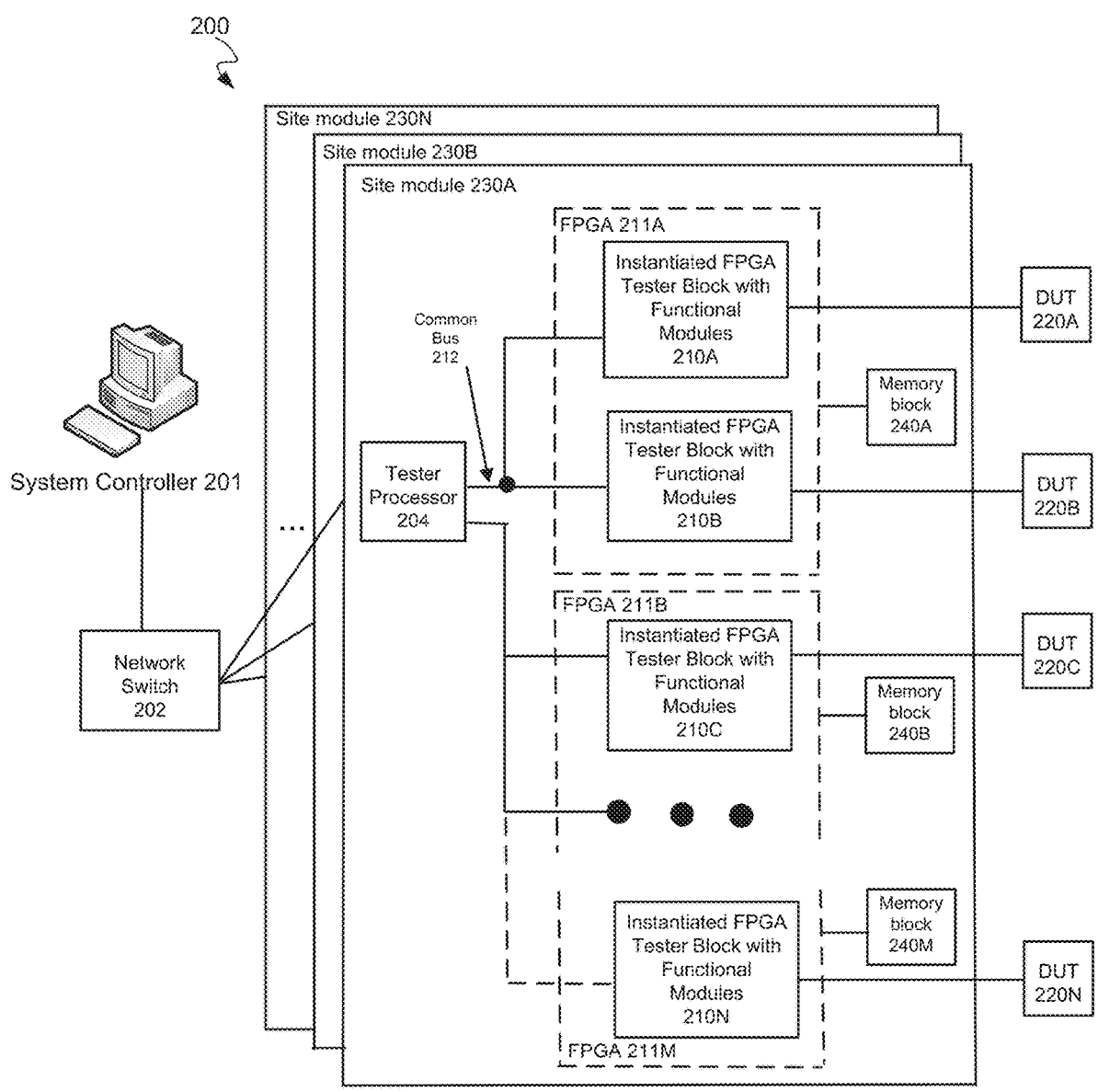
FIG. 2 is a high level schematic block diagram of the interconnections between the system controller, the site modules and the DUTs according to one embodiment of the present invention.
Figure 12:
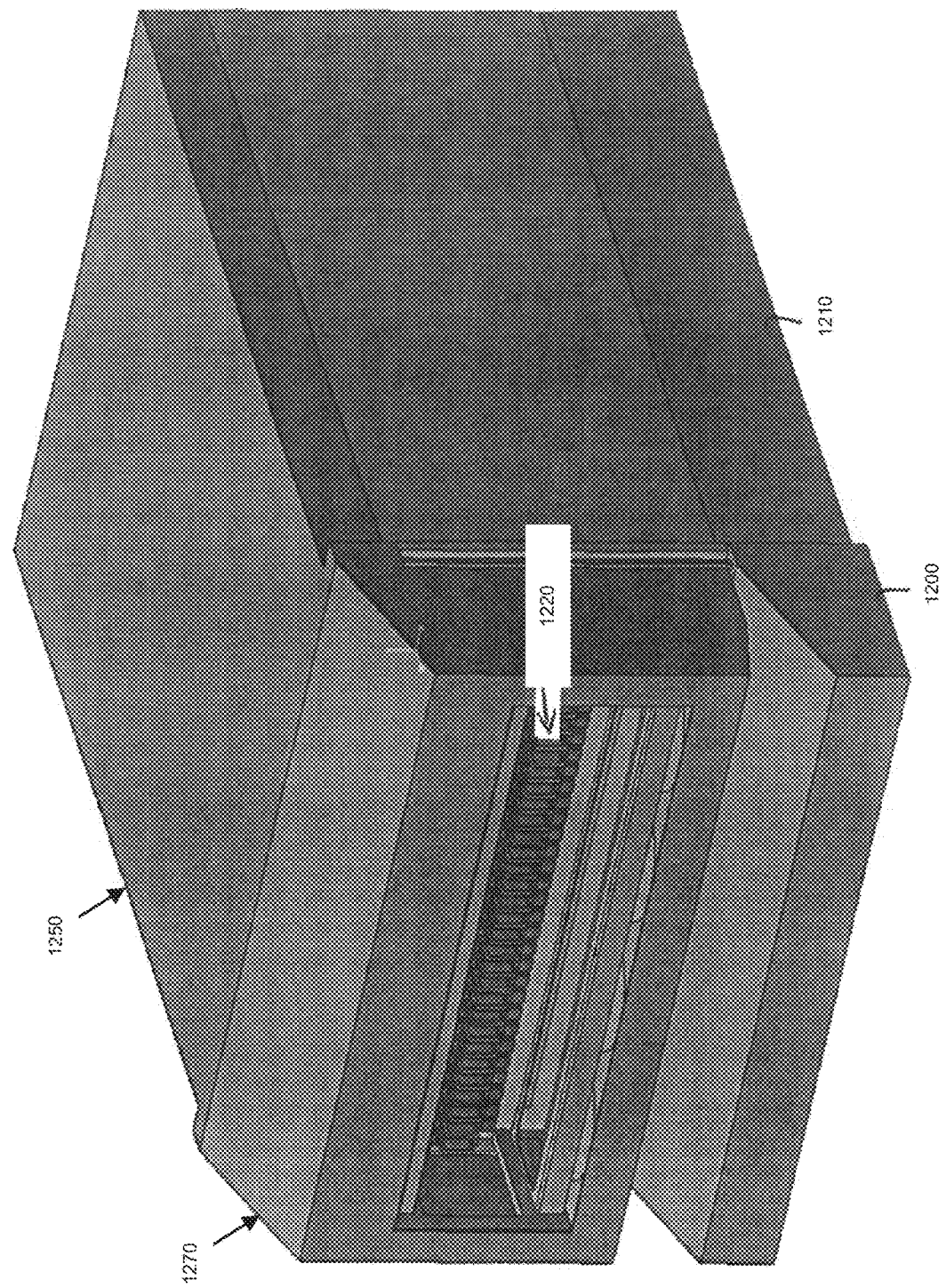
FIG. 12 illustrates a primitive interfaced with a Device Interface Board (DIB) in accordance with an embodiment of the invention.

FIG. 2 is an exemplary high level block diagram of the automatic test equipment (ATE) apparatus 200 in which a tester processor is connected to the devices under test (DUTs) through FPGA devices with built-in functional modules in accordance with an embodiment of the present invention. In one embodiment, ATE apparatus 200 may be implemented within any testing system capable of testing multiple DUTs simultaneously. For example, in one embodiment, apparatus 200 may be implemented inside a primitive as shown in FIG. 12.

Referring to FIG. 2, an ATE apparatus 200 for testing semiconductor devices more efficiently in accordance with an embodiment of the present invention includes a system controller 201, a network switch 202 connecting the system controller to the site module boards 230A-230N, FPGA devices 211A-211M comprising instantiated FPGA tester blocks 210A-210N, memory block modules 240A-240M wherein each of the memory blocks is connected to one of the FPGA devices 211A-211M, and the devices under test (DUTs) 220A-220N, wherein each device under test 220A-220N is connected to one of the instantiated FPGA tester blocks 210A-210N. It should be noted that the DUTs 220A-220N can, in one embodiment, be solid state drives (SSDs). Furthermore, it is possible for a single instantiated FPGA tester block, as shown in FIG. 2, to also be connected to multiple DUTs.

In one embodiment, the system controller 201 may be a computer system, e.g., a personal computer (PC) that provides a user interface for the user of the ATE to load the test programs and run tests for the DUTs connected to the ATE 200. In one embodiment, the system controller 201 may be running the Windows operation system (OS). The Verigy Stylus software executing in the Windows environment is one example of test software normally used during device testing. It provides the user with a graphical user interface from which to configure and control the tests. It can also comprise functionality to control the test flow, control the status of the test program, determine which test program is running, and log test results and other data related to test flow. In one embodiment, the system controller can be connected to and control as many as 512 DUTs.

In one embodiment, the system controller 201 can be connected to the site module boards 230A-230N through a network switch, such as an Ethernet switch. In other embodiments, the network switch may be compatible with a different protocol such as TCP/IP, Fibre Channel, 802.11 or ATM, for instance.

In one embodiment, each of the site module boards 230A-230N may be a separate standalone board used for purposes of evaluation and development that attaches to custom-built load board fixtures, on which the DUTs 220A-220N are loaded, and also to the system controller 201 from where the test programs are received. In other embodiments, the site module boards may be implemented as plug-in expansion cards or as daughter boards that plug into the chassis of the system controller 201 directly. Alternatively, the site module boards may be housed within an enclosure of a primitive (as shown in FIG. 12) and may connect to the various DUTs using a device interface board (DIB).

The site module boards 230A-230N can each comprise at least one tester processor 204 and at least one FPGA device. In one embodiment, the tester processor and its associated memory may be located on a separate board (not shown) affixed to the respective site module. This separate board may be called a Computer On Module (or COM) board. In other words, the FPGA may be located on a separate site module board while the tester processor (with an associated memory) is located on a COM board.

The tester processor 204 and the FPGA devices 211A-211M on the site module board run the test methods for each test case in accordance with the test program instructions received from the system controller 201. In one embodiment the tester processor can be a commercially available Intel x86 CPU or any other well-known processor. Further, the tester processor may be operating on the Ubuntu OS x64 operating system and running the Core Software, which allows it to communicate with the software running on the system controller to run the test methods. In one embodiment, the tester processor 204 may be an x86 processor running the Linux OS or a modified version of the Linux OS. In one embodiment, the Linux OS running on the tester processor is able to receive commands and data from the Windows OS running on the system controller. The tester processor 204 controls the FPGA devices on the site module and the DUTs connected to the site module based on the test program received from the system controller.

The tester processor 204 is connected to and can communicate with the FPGA devices over bus 212. In one embodiment, tester processor 204 communicates with each of the FPGA devices 211A-211M over a separate dedicated bus. In one embodiment, for example in the standard or bypass mode, tester processor 204 can control the testing of the DUTs 220A-220N transparently through the FPGAs with minimal processing functionality allocated to the FPGA devices. In this embodiment, the data traffic capacity of bus 212 can be exhausted rapidly because all the commands and data generated by the tester processor need to be communicated over the bus to the FPGA devices. In other embodiments, the tester processor 204 can share the processing load by allocating functionality to control the testing of the DUTs to the FPGA devices, e.g., in protocol independent data accelerations (PIDA), software directed firmware acceleration (FA LITE) mode or full acceleration (FA) modes as will be discussed further below. In these embodiments, the traffic over bus 212 is reduced because the FPGA devices can generate its own data and also may generate commands depending on the mode.

In one embodiment, each of the FPGA devices 211A-211M is connected to its own dedicated memory block 240A-240M. These memory blocks can, among other things, be utilized to store the test pattern data that is written out to the DUTs. In one embodiment, each of the FPGA devices can comprise two instantiated FPGA tester blocks 210A-210B with functional modules for performing functions including implementation of communicative protocol engines and hardware accelerators as described further herein. Memory blocks 240A-240 M can each contain one or more memory modules, wherein each memory module within the memory block can be dedicated to one or more of the instantiated FPGA tester blocks 210A-210B. Accordingly, each of the instantiated FPGA tester blocks 210A-210B can be connected to its own dedicated memory module within memory block 240A. In another embodiment, instantiated FPGA tester blocks 210A and 210B can share one of the memory modules within memory block 240A. In a different embodiment, each FPGA device can have multiple instantiated FPGA tester blocks, each with a respective memory block.

Further, each of the DUTs 220A-220N in the system can be connected to a dedicated instantiated FPGA tester block 210A-210N in a "tester per DUT" configuration, wherein each DUT gets its own tester block. This allows separate test execution for each DUT. The hardware resources in such a configuration are designed in a manner to support individual DUTs with minimal hardware sharing. This configuration also allows many DUTs to be tested in parallel, where each DUT can be connected to its own dedicated FPGA tester block and be running a different test program. In a different embodiment, each instantiated FPGA tester block may also be connected to and configured to test multiple DUTs.

The architecture of the embodiment of the present invention depicted in FIG. 2 has several advantages. First, it eliminates the need for protocol-specific hardware bus adapter sockets and cards in the system because the communication protocol modules can be programmed directly on the instantiated FPGA tester blocks within the FPGA devices. The instantiated tester blocks can be configured to communicate with the DUTs in any protocols that the DUTs support. Accordingly, if DUTs with different protocol support need to be tested, they can be connected to the same system and the FPGAs can be reprogrammed with support for the associated protocols. As a result, one ATE body can be easily configured to test DUTs supporting many different types of protocols.

In one embodiment, new protocols can be downloaded and installed directly on the FPGAs via a simple bit-stream download from a cache on system controller 201 without any kind of hardware interactions. An FPGA will typically include a configurable interface core (or IP core) that is programmable to provide functionality of one or more protocol based interfaces for a DUT and is programmable to interface with the DUT. For example, the FPGAs 211A-211M in the ATE apparatus 200 will include an interface core that can be configured with the PCIe protocol to test PCIe devices initially and subsequently reconfigured via a software download to test SATA devices. Also, if a new protocol is released, the FPGAs can easily be configured with that protocol via a bit-stream download instead of having to physically switch all the hardware bus adapter cards in the system. Finally, if a non-standard protocol needs to be implemented, the FPGAs can nonetheless be configured to implement such a protocol.

In another embodiment, the FPGAs 211A-211M can be configured to run more than one communicative protocol, wherein these protocols also can be downloaded from system controller 201 and configured through software. In other words, each FPGA implements custom firmware and software images to implement the functionality of one or more PC based testers in a single chip. The required electrical signaling and protocol-based signaling is provided by on-chip IP cores in the FPGAs. As mentioned above, each FPGA is programmable with pre-verified interface or IP cores. This ensures compliance and compatibility according to a given interface standard. The programmable nature of the FPGA is utilized to optimize flexibility, cost, parallelism and upgradeabilty for storage testing applications from SSDs, HDDs and other protocol based storage devices.

For instance, instantiated FPGA tester block 210A can be configured to run the PCIe protocol while instantiated FPGA tester block 210B can be configured to run the SATA protocol. This allows the tester hardware to test DUTs supporting different protocols simultaneously. FPGA 211A can now be connected to test a DUT that supports both PCIe and SATA protocols. Alternatively, it can be connected to test two different DUTs, one DUT supporting the PCIe protocol and the other DUT supporting the SATA protocol, where each instantiated functional module (e.g., 210A, 210B) is configured with a protocol to test the respective DUT it is connect to.

In one embodiment, the interface or IP core in the FPGA may be acquired from a third party vendor but may require some customization to be compatible with the embodiments described herein. In one embodiment, the interface core provides two functions: a) wraps storage commands into a standard protocol for transmission over a physical channel; and 2) is the electrical signal generator and receiver.

The other major advantage of the architecture presented in FIG. 2 is that it reduces processing load on the tester processor 204 by distributing the command and test pattern generating functionality to FPGA devices, where each DUT has a dedicated FPGA module running the test program specific to it. For instance, instantiated FPGA tester block 210A is connected to DUT 220A and runs test programs specific to DUT 220A. The hardware resources in such a configuration are designed in a manner to support individual DUTs with minimal hardware sharing. This "tester per DUT" configuration also allows more DUTs to be tested per processor and more DUTs to be tested in parallel. Furthermore, with the FPGAs capable of generating their own commands and test patterns in certain modes, the bandwidth requirements on bus 212 connecting the tester processor with the other hardware components, including FPGA devices, device power supplies (DPS) and DUTs, is also reduced. As a result more DUTs can be tested simultaneously than in prior configurations.

Figure 3:
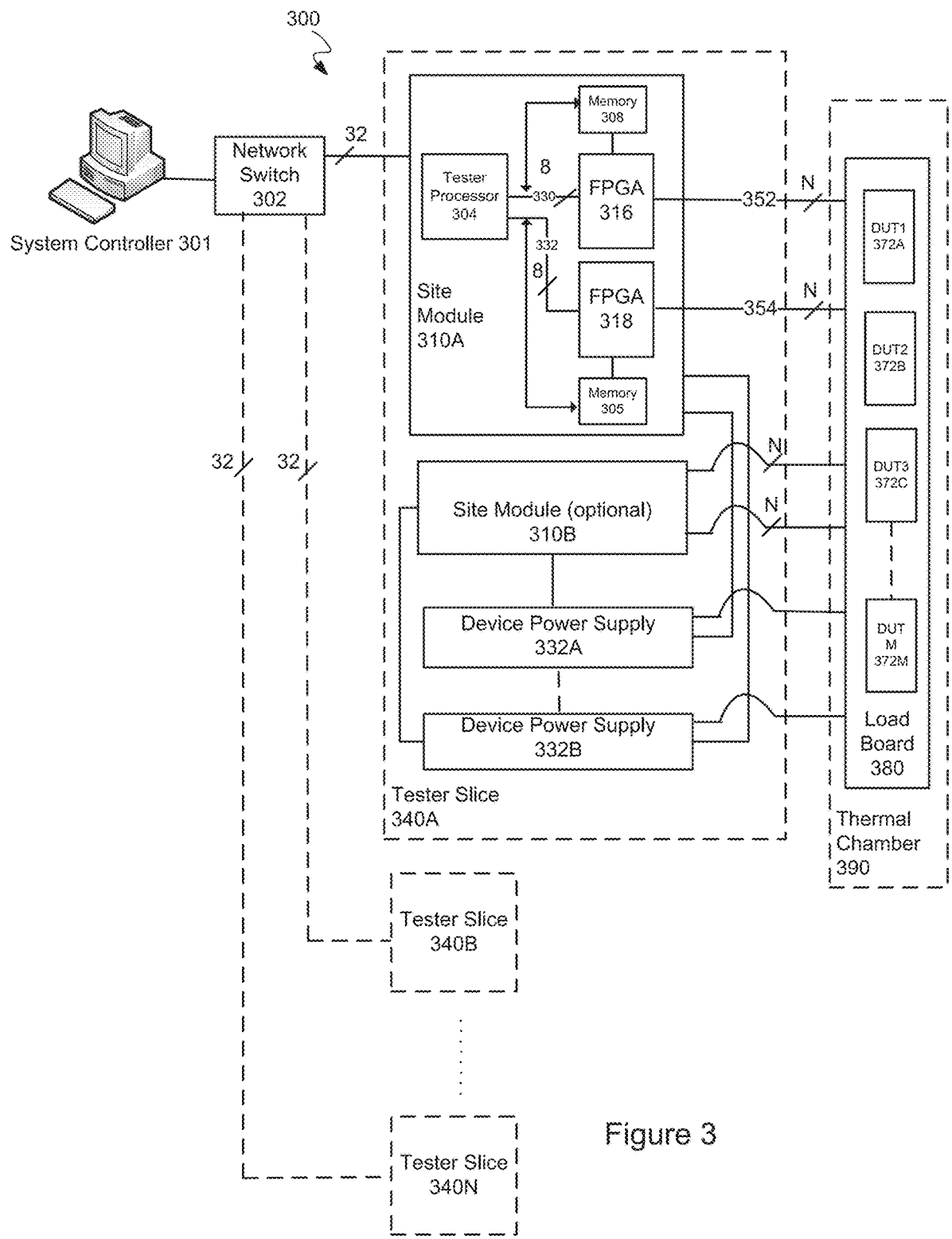
FIG. 3 is a detailed schematic block diagram of the site module and its interconnections with the system controller and the DUTs according to an embodiment of the present invention.

FIG. 3 provides a more detailed schematic block diagram of the site module and its interconnections with the system controller and the DUTs in accordance with an embodiment of the present invention.

Referring to FIG. 3, the site modules of the ATE apparatus, in one embodiment, can be mechanically configured onto tester slices 340A-340N, wherein each tester slice comprises at least one site module. In certain typical embodiments, each tester slice can comprise two site modules and two device power supply boards. In other embodiments, the tester slice may comprise more or fewer site modules and/or power supply boards. Tester slice 340A of FIG. 3, for example, comprises site modules 310A and 310B and device power supply boards 332A and 332B. However, there is no limit to the number of device power supply boards or site modules that can be configured onto a tester slice. Tester slice 340 is connected to system controller 301 through network switch 302. System controller 301 and network switch 302 perform the same function as elements 201 and 202 in FIG. 2 respectively. Network switch 302 can be connected to each of the site modules with a 32 bit wide bus.

As mentioned above, in one embodiment, the system controller 301 may be a computer system, e.g., a personal computer (PC) that provides a user interface for the user of the ATE to load the test programs and run tests for the DUTs connected to the ATE 300. Typically the system controller will run the Windows operating system. The Advantest Stylus is one example of test software normally used during device testing. It provides the user with a graphical user interface from which to configure and control the tests. It can also comprise functionality to control the test flow, control the status of the test program, determine which test program is running, and log test results and other data related to test flow.

Each of the device power supply boards 332A-332B can be controlled from one of the site modules 310A-310B. The software running on the tester processor 304 can be configured to assign a device power supply to a particular site module. In one embodiment, the site modules 310A-310B and the device power supplies 332A-332B are configured to communicate with each other using a high speed serial protocol, e.g., Peripheral Component Interconnect Express (PCIe), Serial AT Attachment (SATA) or Serial Attached SCSI (SAS), for instance.

In one embodiment, each site module is configured with two FPGAs as shown in FIG. 3. Each of the FPGAs 316 and 318 in the embodiment of FIG. 3. is controlled by the tester processor 304 and performs a similar function to FPGAs 211A-211M in FIG. 2. The tester processor 304 can communicate with each of the FPGAs using a 8 lane high speed serial protocol interface such as PCIe as indicated by system buses 330 and 332 in FIG. 3. In other embodiments, the tester processor 304 could also communicate with the FPGAs using different high speed serial protocols, e.g., Serial AT Attachment (SATA) or Serial Attached SCSI (SAS).

FPGAs 316 and 318 are connected to memory modules 308 and 305 respectively, where the memory modules perform a similar function to memory blocks 240A-240N in FIG. 2. The memory modules are coupled with and can be controlled by both the FPGA devices and the tester processor 304.

FPGAs 316 and 318 can be connected to the DUTs 372A-372M on the load board 380 through buses 352 and 354 respectively. The load board 380 is a physical harness that allows a general purpose high speed connection at the site module end that is agnostic to the protocol used to communicate to the DUTs in on lines 352 and 354. At the DUT end, however, in one implementation, the load board may need to be designed so as to have connectors specific to the protocol being used by the DUT.

The DUTs 372A-372M, in one embodiment of the invention, are loaded on a load board 380 that is placed inside a thermal chamber 390 for testing. The DUTs 372A-372M and the load board 380 derive power from the device power supplies 332A and 332B.

The number of DUTs that can be connected to each FPGA is contingent on the number of transceivers in the FPGA and the number of I/O lanes required by each DUT. In one embodiment, FPGAs 316 and 318 can each comprise 32 high speed transceivers and buses 352 and 354 can each be 32 bits wide, however, more or less can be implemented depending on the application. If each DUT requires 8 I/O lanes, for example, only 4 DUTs can be connected to each FPGA in such a system.

In one embodiment, the communication protocol used to communicate between the tester processor 304 and the DUTs 372A-M can advantageously be reconfigurable. The communicative protocol engine in such an implementation is programmed directly into one or both of the FPGAs on the tester slice. The FPGA (e.g., 316 or 318) can therefore be configured to communicate with the DUTs in any protocol that the DUTs support. This advantageously eliminates the need for swapping out tester each time a DUT with a different protocol needs to be tested. In one embodiment, the protocols can be high speed serial protocols, including but not limited to SATA, SAS PCIe, or any new third party protocol, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In one embodiment of the present invention, each FPGA comprises a number of protocol engine modules, wherein each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

Figure 4:
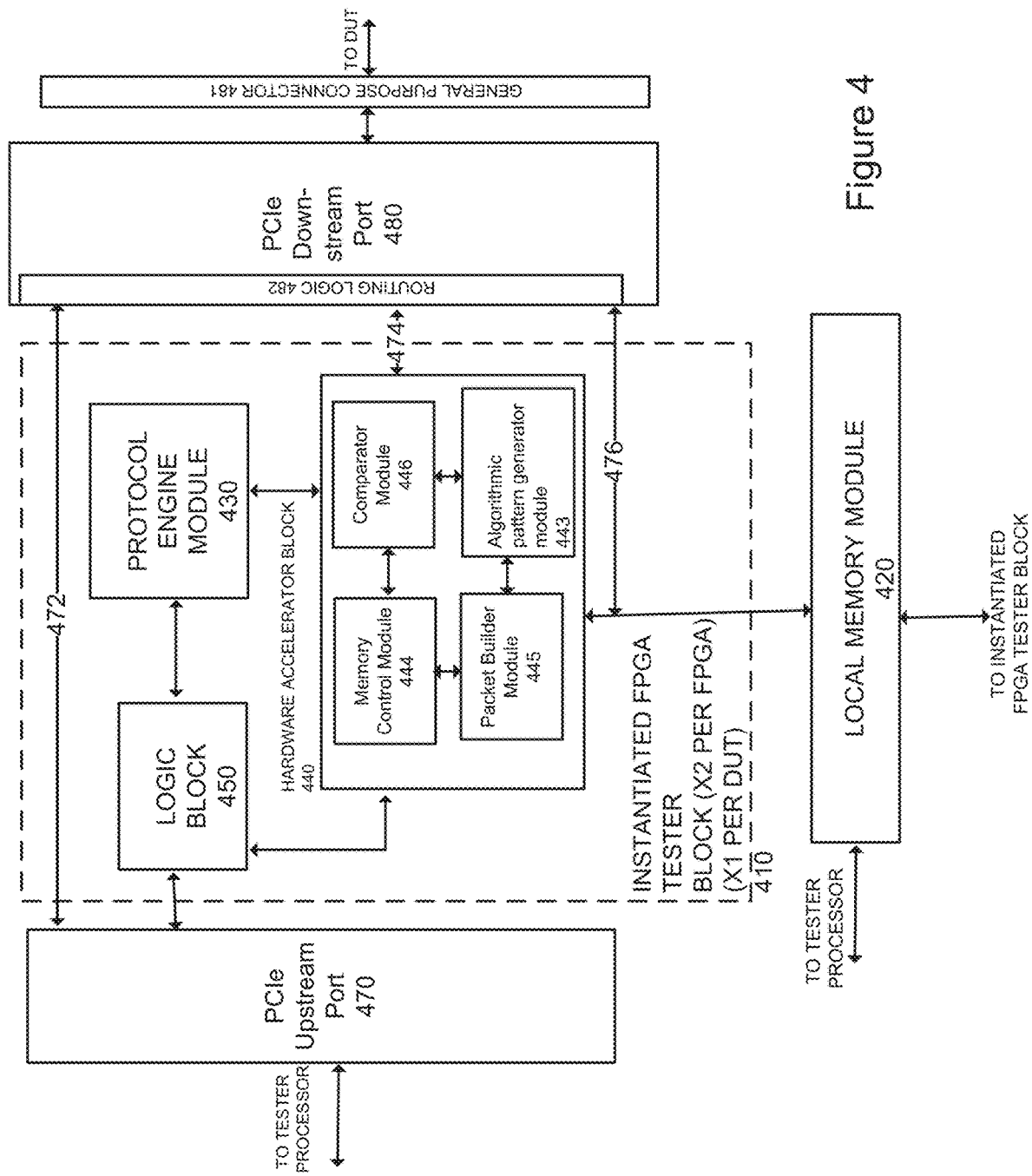
FIG. 4 is a detailed schematic block diagram of the instantiated FPGA tester block of FIG. 2 according to an embodiment of the present invention.

FIG. 4 is a detailed schematic block diagram of an instantiated FPGA tester block of FIG. 2 according to an embodiment of the present invention. Referring to FIG. 4, the instantiated FPGA tester block 410 is connected to the tester processor through PCIe upstream port 470 and to the DUT through PCIe downstream port 480.

Instantiated FPGA block 410 can comprise a protocol engine module 430, a logic block module 450, and a hardware accelerator block 440. The hardware accelerator block 440 can further comprise a memory control module 444, comparator module 446, a packet builder module 445, and an algorithmic pattern generator (APG) module 443.

In one embodiment, logic block module 450 comprises decode logic to decode the commands from the tester processor, routing logic to route all the incoming commands and data from the tester processor 304 and the data generated by the FPGA devices to the appropriate modules, and arbitration logic to arbitrate between the various communication paths within instantiated FPGA tester block 410.

In one implementation, the communication protocol used to communicate between the tester processor and the DUTs can advantageously be reconfigurable. The communication protocol engine in such an implementation is programmed directly into the protocol engine module 430 of instantiated FPGA tester block 410. The instantiated FPGA tester block 410 can therefore be configured to communicate with the DUTs in any protocol that the DUTs support. The pre-verified interface or IP cores mentioned above, for example, can be programmed into the protocol engine module 430. This ensures compliance and compatibility according to a given interface standard. Further, the IP core allows the tester to achieve flexibility in that the IP core enables software-based changing of interfaces. Embodiments provide an ability to test multiple types of DUTs independent of the hardware bus adapter sockets. With such interface flexibility, new interfaces may be loaded into the IP core of a programmable chip thereby eliminating the need for the hardware bus adapter sockets (discussed in connection with FIG. 1).

In one embodiment, for example, for storage/SSDs/HDDs, each FPGA comprises a configurable IC that connects to a SSD and that is programmable to provide storage based patterns through a storage specific interface such as SATA or SAS. In one embodiment, an FPGA may be an SSD module-based tester that uses protocol-based communications to interface with a DUT or module. In one embodiment, the configurable interface core may be programmed to provide any standardized protocol-based communications interface. For example, in one embodiment, in the case of an SSD module-base test, the interface core may be programmed to provide standardized protocol-based communications interfaces such as SATA, SAS, etc.

Accordingly, from an electrical perspective, the FPGAs utilize an IP core instead of a hardware bus adapter socket. Enabled by software programming of the programmable chip resources of an FPGA, a given IP core may be easily reprogrammed and replaced with another IP core without changing the physical FPGA chip or other hardware components. For example, if a given FPGA-based tester currently supports SATA, all that would be required to be able to connect to a SAS DUT is for the FPGA to be reprogrammed to use a SAS IP core instead of the existing IP core configured for SATA.

This advantageously eliminates the need for hardware bus adapter cards and no protocol-specific hardware need be replaced to test DUTs with different protocol support. In one embodiment, the protocols can be high speed serial protocols, including but not limited to SATA, SAS or PCIe, etc. The new or modified protocols can be downloaded and installed directly on the FPGAs via a simple bit-stream download from the system controller through the tester processor without any kind of hardware interactions. Also, if a new protocol is released, the FPGAs can easily be configured with that protocol via a software download.

In FIG. 4, if the DUT coupled to the PCIe downstream port 480 is a PCIe device, a bit-file containing the instantiation of the PCIe protocol can be downloaded through the PCIe upstream port 470 and installed in the IP core on the protocol engine module 430. Each FPGA device 316 or 318 can comprise one or more instantiated FPGA tester block and, consequently, one or more protocol engine modules. The number of protocol engine modules that any one FPGA device can support is limited only by the size and gate count of the FPGA.

In one embodiment of the present invention, each of the protocol engine modules within a FPGA device can be configured with a different communicative protocol. Accordingly, an FPGA device can be connected to test multiple DUTs, each supporting a different communicative protocol simultaneously. Alternatively, an FPGA device can be connected to a single DUT supporting multiple protocols and test all the modules running on the device simultaneously. For example, if an FPGA is configured to run both PCIe and SATA protocols, it can be connected to test a DUT that supports both PCIe and SATA protocols. Alternatively, it can be connected to test two different DUTs, one DUT supporting the PCIe protocol and the other DUT supporting the SATA protocol.

The hardware accelerator block 440 of FIG. 4 can be used to expedite certain functions on FPGA hardware than would be possible to do in software on the tester processor. The hardware accelerator block 440 can supply the initial test pattern data used in testing the DUTs. It can also contain functionality to generate certain commands used to control the testing of the DUTs. To generate test pattern data, accelerator block 440 uses the algorithmic pattern generator module 443.

The hardware accelerator block 440 can use comparator module 446 to compare the data being read from the DUTs to the data that was written to the DUTs in a prior cycle. The comparator module 446 comprises functionality to flag a mismatch to the tester processor 304 to identify devices that are not in compliance. More specifically, the comparator module 446 can comprise an error counter that keeps track of the mismatches and communicates them to the tester processor 304.

Hardware accelerator block 440 can connect to a local memory module 420. Memory module 420 performs a similar function to a memory module within any of the memory blocks 240A-240M. Memory module 420 can be controlled by both the hardware accelerator block 440 and the tester processor 304. The tester processor 304 can control the local memory module 420 and write the initial test pattern data to it.

The memory module 420 stores the test pattern data to be written to the DUTs and the hardware accelerator block 440 accesses it to compare the data stored to the data read from the DUTs after the write cycle. The local memory module 420 can also be used to log failures. The memory module would store a log file with a record of all the failures the DUTs experienced during testing. In one embodiment, the accelerator block 440 has a dedicated local memory module block 420 that is not accessible by any other instantiated FPGA tester blocks. In another embodiment, the local memory module block 420 is shared with a hardware accelerator block in another instantiated FPGA tester block.

Hardware accelerator block 440 can also comprise a memory control module 444. The memory control module 444 interacts with and controls read and write access to the memory module 420.

Finally, hardware accelerator block 440 comprises a packet builder module 445. The packet builder module is used by the hardware accelerator block in certain modes to construct packets to be written out to the DUTs comprising header/command data and test pattern data.

The site module can comprise a general purpose connector 481. Because the protocol engine module 430 can be configured to run any number of various communicative protocols, a general purpose high speed connector 481 is required on the site module. Accordingly, if the protocol implemented on the protocol engine module 430 needs to be changed, no accompanying physical modification needs to be made on the site module. The site module connects to the DUT using load board 380 that can connect to the general purpose connector on the site module end, but is specific to the protocol being implemented on the DUT end. DUTs supporting different communicative protocols will require different configurations. Accordingly, the load board needs to be switched out and replaced if the protocol is reprogrammed to accommodate DUTs requiring a different configuration.

FIG. 12 illustrates a primitive 1210 interfaced with a Device Interface Board (DIB) 1200 in accordance with an embodiment of the invention. Similar to the tester slice (e.g., 340A, etc.) shown in FIG. 3, the primitive of FIG. 12 is a type of discrete test module that fits into a test head and comprises the test circuitry, which performs tests on the DUTs in accordance with a test plan. A primitive comprises an enclosure 1250 within which all the various electronics, e.g., site modules, power supplies, etc. are housed. The DIB 1200 can connect with a plurality of DUTs 1220 using custom connectors sized for the DUTs 1220. The DUTs physically interface and electronically interface to the DIB 1200. The primitive can also comprise an enclosure 1270. The DIB 1200 interfaces to a universal backplane (not shown) of the primitive 1210 through a load board (not shown) similar to load board 380 shown in FIG. 3. The primitive 1210 contains test circuitry (similar to tester slice 340A shown in FIG. 3) for performing a test plan on the DUTs 1220. The primitive 1210 can operate independently of any other primitive and is connected to a control server (similar to system controller 301 shown in FIG. 3).

It should be noted that DUTs connected to any given tester slice (e.g., 340A-340N) or any given primitive are capable of running a different protocol than one or more other DUTs connected to the same respective tester slice or primitive. For example, the primitive 1210 may be connected to and used to test a plurality of DUTs 1220, each of which can run a different protocol, e.g., SATA, ATA, SCSI, etc. In one embodiment, primitive 1210 may be connected to and used to test primarily SSD drives.

Figure 13:
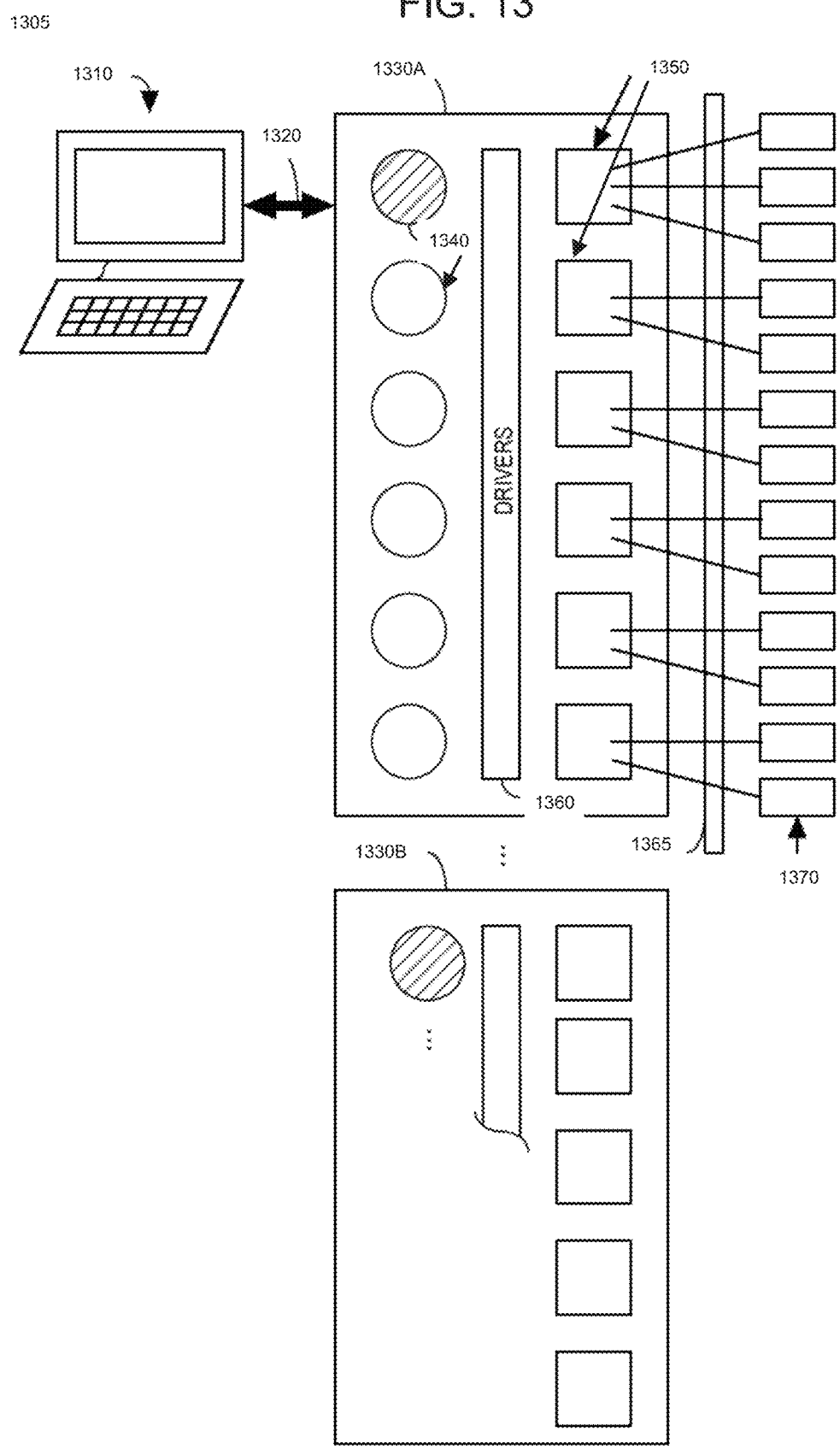
FIG. 13 is an exemplary high level block diagram of the automatic test equipment (ATE) apparatus in which a host controller is connected to and controls test operations for a plurality of primitives in accordance with an embodiment of the present invention.

FIG. 13 is an exemplary high level block diagram of the automatic test equipment (ATE) apparatus in which a host controller is connected to and controls test operations for a plurality of primitives in accordance with an embodiment of the present invention. FIG. 13 illustrates the overall integrated system or testing framework 1305 for testing SSDs.

In one embodiment, a Windows based host controller 1310 may be communicatively coupled to several different primitives, e.g., 1330A and 1330B. The Windows based host controller 1313 is capable of displaying graphical user interfaces to users for displaying information and for accepting user input. A communication backplane 1320 is coupled between the host controller 1313 and one or more primitives 1330A and 1330B. Each primitive comprises a number of tester slices (e.g., tester slices 340A-340N). In one embodiment, each primitive may comprise a number of COM boards 1340 (comprising a tester processor and associated memory) that are coupled to a number of FPGA tester slices 1350 via drivers 1360. (As mentioned previously, in one embodiment, the tester processor may be located on a COM board that is a separate board from the tester slices comprising the FPGAs). The tester slices, in one embodiment, are coupled to DUTs (e.g. SSDs) via a device interface board 1365. A different DIB can be used to support SSDs of different form factors and connection types. There can be several primitives within a rack, where each primitive is coupled to and controlled by the host controller. This allows a large volume of DUTs to be tested concurrently.

In one embodiment, the COM boards 1340 may contain an instance of the embedded OS platform in accordance with the present invention. The COM boards 1340 may control the tester slices 1350 within the primitives. The embedded OS platform is configured to communicate on one side with the host controller 1313 and on the other side the various FPGA tester slices 1350 that are populated within a primitive. In one embodiment, the embedded OS platform can be a heavily modified version of the Linux OS. There can be as many as 32 instances of embedded OS platforms within the system 1305 and controlled by the host controller 1313. The various OS platforms provide functionality to communicate with the FPGA tester boards 1350 also to communicate directly with the DUTS 1370.

II. Multiple FPGA-Based Acceleration Modes for Testing DUTS

In certain embodiments, hardware accelerator block 440 can be programmed by the tester processor 304 to operate in one of several modes of hardware acceleration.

In bypass or standard mode, the hardware accelerator is bypassed and commands and test data are sent by the tester processor 304 directly to the DUT through path 472.

In hardware accelerator pattern generator mode, test pattern data is generated by the APG module 443 while the commands are generated by the tester processor 304. The test packets are transmitted to the DUT through path 474. This mode is also known as Protocol Independent Data Acceleration (PIDA) mode.

In hardware accelerator memory mode, the test pattern data is accessed from local memory module 420 while the commands are generated by the tester processor 304. The test pattern data is transmitted to the DUT through path 476. Routing logic 482 is needed to arbitrate between paths 472, 474 and 476 to control the flow of data to the DUT.

In hardware accelerator packet builder mode, the test pattern data may be generated by the APG module 443 and the packet builder module 445 is used to construct packets to be written out to the DUTs comprising header/command data and test pattern data. The test packets are transmitted to the DUT through path 474. This mode is also known as Full Acceleration (FA) mode.

In software directed firmware acceleration mode (also referred to as FA-LITE mode), test pattern data is generated by the APG module 443 while the commands are generated by the tester processor 304. The software directed firmware acceleration mode combines the approaches of the PIDA and the FA modes. In the PIDA mode, for example, the commands are sent by the tester processor 304 to the DUT directly. By comparison, in the FA-LITE mode, the commands are generated by the tester processor 304 and placed in a FIFO queue, which feeds the commands to the firmware (e.g., the packet builder module 445 in the FPGA). This allows the commands to be queued up in a buffer and be readily available for the FPGA as bandwidth frees up. This allows the firmware to operate at full speed without any interruptions waiting for new commands. The FPGA can then generate data at full speed to the DUTs.

Figure 5:
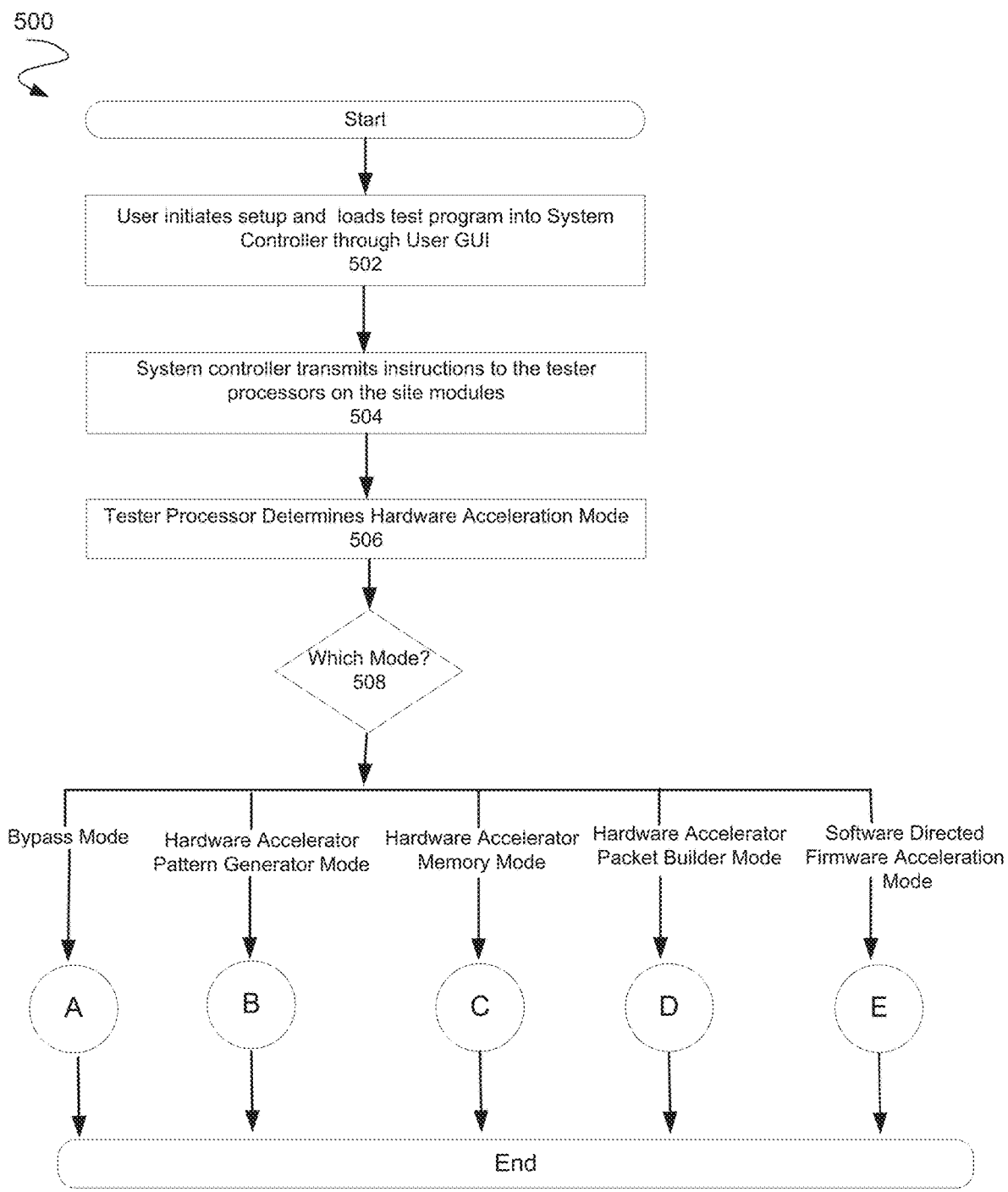
FIG. 5 is a high level flowchart of an exemplary method of testing DUTs according to an embodiment of the present invention.

FIG. 5 depicts a flowchart 500 of an exemplary process of testing DUTs according to an embodiment of the present invention. The invention, however, is not limited to the description provided by flowchart 500. Rather, it will be apparent to persons skilled in the relevant art(s) from the teachings provided herein that other functional flows are within the scope and spirit of the present invention.

Flowchart 500 will be described with continued reference to exemplary embodiments described above in reference to FIGS. 2, 3 and 4, though the method is not limited to those embodiments.

Referring now to FIG. 5, the user initiates setup and loads the test program into system controller at block 502. Initiating setup can comprise choosing one or more protocols from a library of available protocols to be configured onto the FPGA devices in the ATE apparatus 200. The protocols are cached as files on the system controller 301 and can be downloaded as bit files onto the FPGAs. The user can select the protocol from a list of releases available through a graphical user interface. Before a protocol is made available as an option, it has to be built, tested and integrated into a release. FPGA configurations that are released, among other things, contain definitions regarding the protocols supported and the number of transceivers available to connect DUTs. The library of releases can then be made available to a user through a graphical user interface on the system or host controller.

At block 502, the user also loads the test program into the system controller 301 through the graphical user interface. The test program defines all the parameters of the test that needs to be run on the DUTs. At block 504, the system controller transmits instructions to the tester processor on the site module 313A. This step includes the transmission of the bit files for the protocol engines to be programmed onto the FPGAs. The system controller can comprise routing logic to route instructions for a particular test program to the tester processor connected to the DUT controlled by the test program.

At block 506, after receiving instructions from the system controller, the tester processor 304 can determine the hardware acceleration mode for running the tests on the DUTs connected to site module 313A.

In one embodiment, the tester processor 304 can operate in one of five different hardware acceleration modes. Each functional mode is configured to allocate functionality for generating commands and test data between the tester processor 304 and the FPGAs 316 and 318. In one embodiment, the tester processor can be programmed to operate in bypass or standard mode, wherein all the commands and test data for testing the DUTs is generated by the tester processor 304 and the FPGAs 316 and 318 are bypassed.

In another embodiment, the tester processor 304 can be programmed to operate in hardware accelerator pattern generator mode (or PIDA mode), wherein pseudo-random or random data to be used in the testing of the DUTs is generated by the FPGAs 316 and 318 and the comparing is also done by the FPGAs, but the tester processor handles the command generation.

In yet another embodiment, the tester processor 304 can be programmed to operate in hardware accelerator memory mode, wherein the test pattern is pre-written onto the memory module connected to each FPGA 316 and 318 by the tester processor during initial set-up. The FPGAs in this mode access the dedicated memory device to retrieve the test data to be written to the DUTs, read the test data from the DUTs and compare the read data with the data written on the memory device. In this mode, each of the FPGAs control the memory device in response to read and write operations from the DUTs. The tester processor, however, is still responsible for the command generation in this mode.

In still another embodiment, the tester processor 304 can be programmed to operate in hardware accelerator packet builder mode (or Full Acceleration mode), wherein the data and basic read/write/compare commands are generated by the FPGAs 316 and 318.

In one embodiment, in software directed firmware acceleration mode (also referred to as FA-LITE mode), the commands are still generated by the tester processor 304. However, the commands generated by the tester processor 304 are placed in a FIFO queue, which feeds the commands to the firmware (e.g., the packet builder module 445 in the FPGA). This allows the commands to be queued up in a buffer and be readily available for the FPGA as bandwidth frees up. This allows the firmware to operate at full speed without any interruptions waiting for new commands.

At block 508, the tester processor branches out to the mode under which the test will be run.

It should be noted that the FPGAs can be programmed with any of the five functional modes discussed above, namely, the bypass mode, the hardware accelerator pattern generator mode, the hardware accelerator memory mode, the hardware accelerator packet builder mode and the software directed firmware acceleration mode. In one embodiment, the computer or system controller that the tester card is connected to via connector 1310 will perform the functions of the tester processor 304.

II A) Bypass (or Standard) Mode

Figure 6:
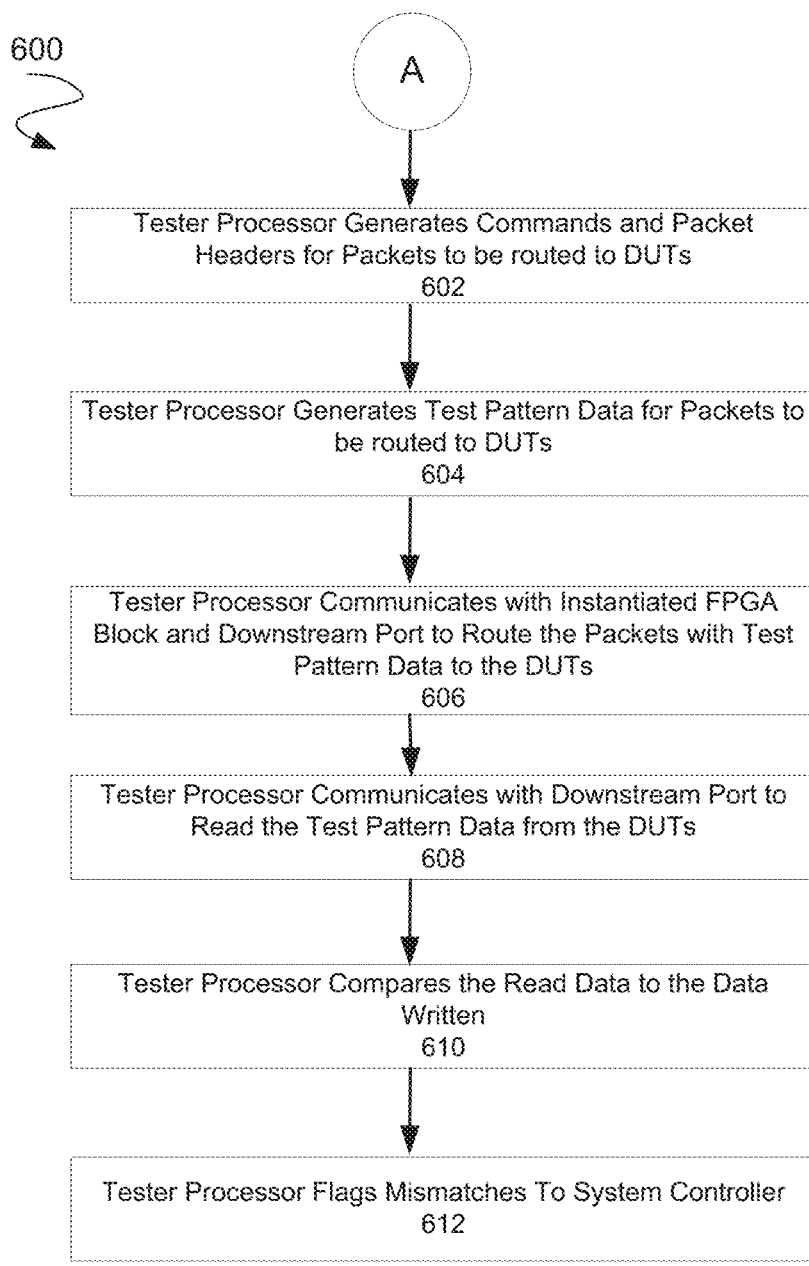
FIG. 6 is a continuation of FIG. 5 and is a flowchart of an exemplary method of testing DUTs in the bypass mode in one embodiment of the present invention.

FIG. 6 depicts a flowchart 600 of an exemplary process of testing DUTs in the bypass mode according to an embodiment of the present invention. The invention, however, is not limited to the description provided by flowchart 600. Rather, it will be apparent to persons skilled in the relevant art(s) from the teachings provided herein that other functional flows are within the scope and spirit of the present invention.

Flowchart 600 will be described with continued reference to exemplary embodiments described above in reference to FIGS. 2, 3 and 4, though the method is not limited to those embodiments.

Referring now to FIG. 6, in bypass mode, at block 602 the tester processor 304 generates commands and packet headers for the test packets to be routed to the DUTs. The tester process at block 604 also generates the test pattern data for the packets to be routed to the DUTs. In this mode there is no hardware acceleration because the tester processor generates its own commands and test data.

At block 606, the tester processor communicates with instantiated FPGA block 410 and downstream port 480 to route the test packets containing the test pattern data to the DUTs. The bypass mode is a pass through mode, wherein, with some limited exceptions, the commands and data pass transparently through the instantiated FPGA block 410 directly to the DUTs. The DUTs are directly controlled by the tester processor 304 in bypass mode. While the instantiated FPGA block can comprise logic to route the packets through to the downstream port, it is not involved in either the command generation (also referred to as "signaling") or the data generation.

At block 608, the tester processor 304 communicates with downstream port 480 to initiate a read operation from the DUTs of the data that was previously written to the DUTs at block 606. At block 610, the tester processor compares the data read from the DUTs to the data written at block 606. If there is any mismatch between the data written at block 606 and the data read at block 610, a flag is sent by the tester processor 304 to the system controller 301 at block 612. The system controller will then flag the mismatch to the user.

In bypass mode, tester processor 304 is constrained in the number of DUTs it can support because its processing capabilities can be maximized quickly from generating all the commands and test data for the DUTs. Also, the number of DUTs that can be supported by site module 310A is further limited by the bandwidth constraints on system buses 330 and 332. In bypass mode, the bandwidth of buses 330 and 332 is exhausted relatively quickly because of the large volume of data that is transmitted by the tester processor 304 over to the DUTs. Thus, other modes with more hardware acceleration are made available, wherein the FPGA devices have more functionality to generate test data and commands.

II B) Hardware Accelerator Pattern Generator Mode (PIDA Mode)

Figure 7:
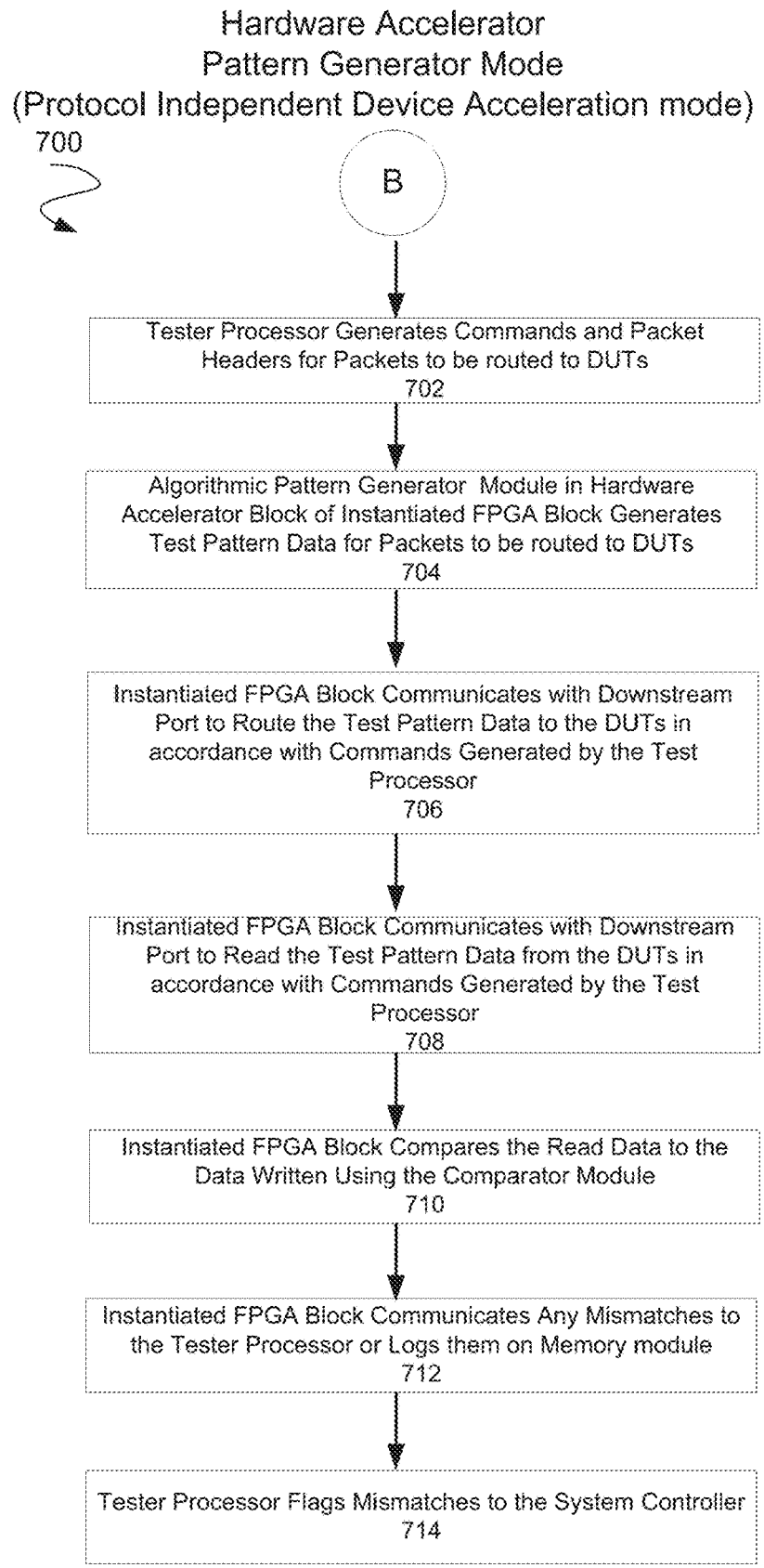
FIG. 7 is a continuation of FIG. 5 and is a flow chart of an exemplary method of testing DUTs in the hardware accelerator pattern generator mode in one embodiment of the present invention.

FIG. 7 depicts a flowchart 700 of an exemplary process of testing DUTs in the hardware accelerator pattern generator mode according to an embodiment of the present invention. The invention, however, is not limited to the description provided by flowchart 700. Rather, it will be apparent to persons skilled in the relevant art(s) from the teachings provided herein that other functional flows are within the scope and spirit of the present invention.

Flowchart 700 will be described with continued reference to exemplary embodiments described above in reference to FIGS. 2, 3 and 4, though the method is not limited to those embodiments.

Referring now to FIG. 7, a method of hardware acceleration is shown wherein the FPGA devices share data generation functionality so as to relieve the processing load on the tester processor 304 and the data load on system buses 330 and 332. At block 702 of the hardware accelerator pattern generator mode, the tester processor 304 generates commands and packet headers for the packets to be routed to the DUTs. The tester process retains the functionality for signaling in this mode. The algorithmic pattern generator module 443 within the hardware accelerator block 440 generates the pseudo random test data to be written to the DUTs at block 704. The logic block module 450 comprises functionality for routing the data generated and adding it to the packets to be written out to the DUTs.

The mode is considered "hardware accelerated" because the functionality for generating data can be done much faster in hardware by the algorithmic pattern generator of the FPGA device than in software by the tester processor. Also the "tester per DUT" architecture allows the DUT to be directly connected to its own dedicated instantiated FPGA tester block generating test pattern data for the DUT as shown in FIG. 4, which results in a substantial increase in bandwidth over the bypass mode where the tester processor 304 supplies all commands and data to the DUTs over system buses, e.g., buses 330 and 332. With the FPGA devices sharing in the data generation functionality, the system buses 330 and 332 are freed up so commands can be communicated to the FPGAs at a faster rate than in the bypass mode. Further, for devices, such as solid state drives that require several iterations of testing, having a dedicated data path through the instantiated FPGA tester block speeds up testing considerably over one where the resources of the tester processor are shared by several DUTs. It also allows the DUT to operate at close to full performance because it does not have to wait for the tester processor to allocate processing resources to it.

In one embodiment, the algorithmic pattern generator module 443 can be programmed to generate data on the fly. The APG module can generate incremental patterns, pseudo-random patterns or some type of constant pattern. The APG module can also have certain gating capabilities to generate test patterns with stripes, diagonal stripes or alternating patterns. In one embodiment, the APG module can use finite state machines, counters or linear feedback shift registers, among other things, to generate test patterns.

In some implementations, the APG module can be provided a starting seed as an initial value to generate more complex random patterns. As mentioned above, for example, using the sector number as a seed, the APG module will generate a reproducible sequence of any length, e.g., the length of the odd sector size. When the data needs to be read back, it can be regenerated again (using the sector address as a seed) so that it can be compared with the data read back from the DUTs in order to ensure the integrity of the DUTs.

At step 706, the instantiated FPGA block 410 communicates with the downstream port 480 to route the test pattern data to the DUTs in accordance with the commands and packet headers generated by the tester processor. The instantiated FPGA block 410, at step 708, communicates with the downstream port to read the test pattern data from the DUTs in accordance with commands generated by the tester processor. The comparator module 446 of the hardware accelerator block 440 is then used to compare the read data to the data written to the DUTs at block 710. The APG module 443 is designed in a way such that the comparator module can perform read operations on it with the same parameters that were used to generate the pseudo-random data and receive the same data that was written to the DUTs at block 704. The APG module 443 regenerates the data that was written to the DUTs on the fly and communicates it to the comparator module 446. Any mismatches are either logged on memory module 420 by the memory control module 444 or communicated by the instantiated FPGA block to the tester processor at block 712. The tester processor subsequently flags mismatches to the system controller at block 714 after receiving the error log.

Note that in the PIDA mode, the software on the tester processor 304 configures the firmware (including the FPGA) to generate data for block transfers to the DUT. While the FPGA is configured to generate data for the DUTs, the commands are generated by the tester processor 304 and sent directly within the packets that are transmitted to the DUTs. Further, the tester processor 304 tracks and manages the commands sent to the DUTs. In one embodiment, the DUTs transfers the data that is read from it to the FPGA (e.g., to the local memory module 420, to the comparator module 446, etc.). In response to the data transfer from the DUT, the FPGA block 410 may take one of several actions including, for example, invoking the comparator module 446 of the hardware accelerator block 440 to compare the data read from the DUTs to the data written to the DUTs.

II C) Hardware Accelerator Memory Mode

Figure 8:
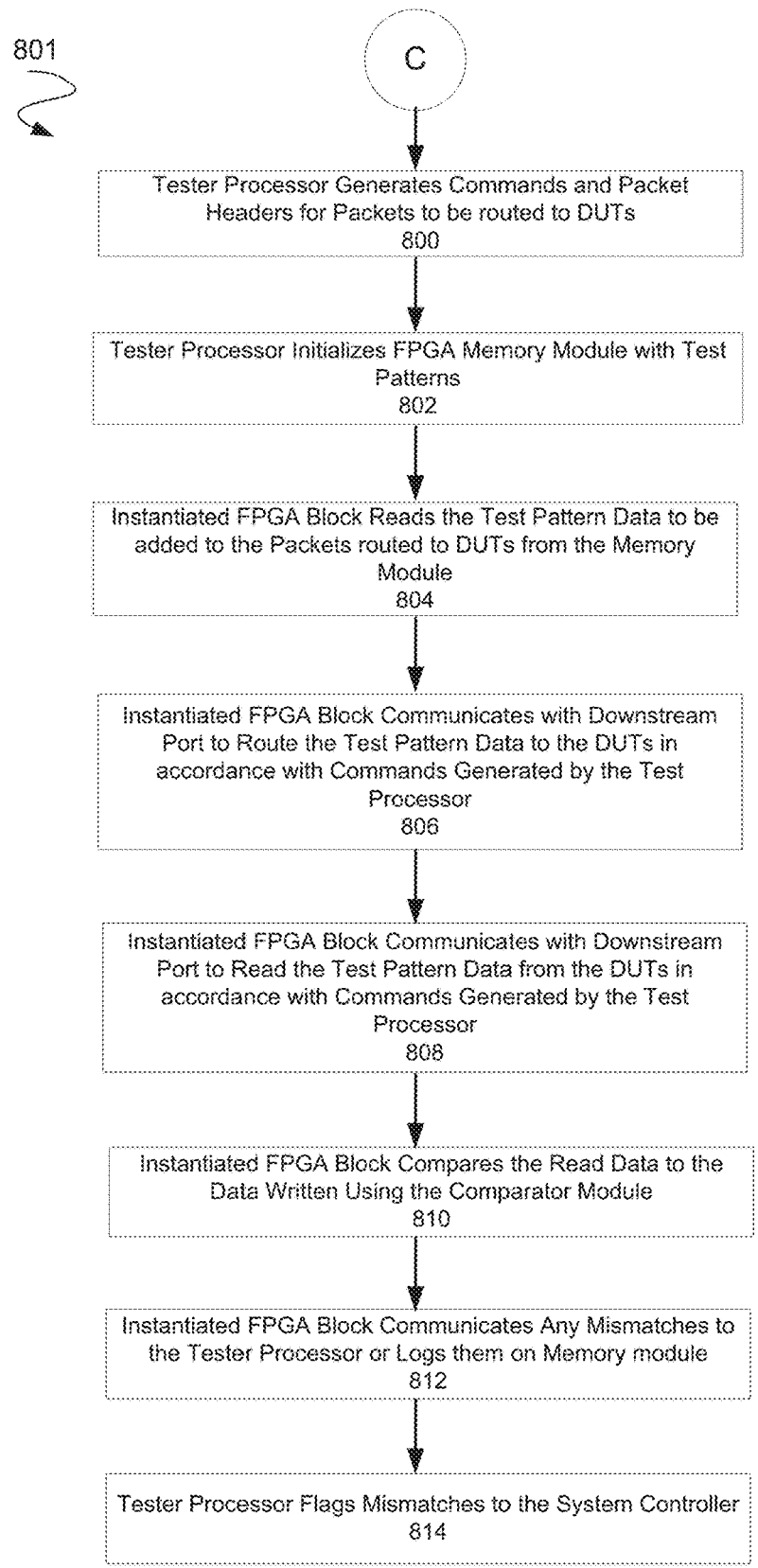
FIG. 8 is a continuation of FIG. 5 and is a flow chart of an exemplary method of testing DUTs in the hardware accelerator memory mode in one embodiment of the present invention.

FIG. 8 depicts a flowchart 801 of an exemplary process of testing DUTs in the hardware accelerator memory mode according to an embodiment of the present invention. The invention, however, is not limited to the description provided by flowchart 801. Rather, it will be apparent to persons skilled in the relevant art(s) from the teachings provided herein that other functional flows are within the scope and spirit of the present invention.

Flowchart 801 will be described with continued reference to exemplary embodiments described above in reference to FIGS. 2, 3 and 4, though the method is not limited to those embodiments.

Referring now to FIG. 8, a method of hardware acceleration is shown wherein the FPGA devices share data generation functionality so as to relieve the processing load on the tester processor 304 and the data load on system buses 330 and 332. As compared to the hardware accelerator pattern generator mode, in the hardware accelerator memory mode, the instantiated FPGA tester block accesses local memory module 420 for the data to be written to the DUTs instead of using the APG module 443.

At block 800 of the hardware accelerator pattern memory mode, the tester processor 304 generates commands and packet headers for the packets to be routed to the DUTs. The tester processor retains the functionality for signaling in this mode. At block 802, the tester processor initializes the local memory module 420 of the instantiated FPGA tester block 410 with test patterns to be written out to the DUTs. One advantage of the hardware accelerator memory mode is that the test patterns generated by the tester processor may constitute real random data as opposed to pseudo-random data generated by the APG module 443 in the hardware accelerator pattern generator mode. Both the tester processor and the instantiated FPGA tester block have read and write access to the local memory module 420. However, the tester processor only accesses memory module 420 during initial set-up. During the accelerator mode, the tester processor does not access the memory module because the additional processing load on the tester processor 304 and the additional data load on the system buses 330 and 332 slows the acceleration down considerably.

At block 804, the instantiated FPGA tester block reads the test pattern data to be routed to the DUTs from the memory module 420. Because the memory module 420 is dedicated to the FPGA tester block or shared with just one other FPGA tester block, there is a high bandwidth connection between the two resulting in fast read operations. The logic block module 450 comprises functionality for routing the data generated and adding it to the packets to be written out to the DUTs.

After the data has been added to the packets, at block 806, the instantiated FPGA tester block communicates with the downstream port 480 to route the test pattern data to the DUTs in accordance with the commands and packet headers generated by the tester processor. The instantiated FPGA block 410, at step 808, communicates with the downstream port to read the test pattern data from the DUTs in accordance with commands generated by the tester processor. The comparator module 446 of the hardware accelerator block 440 is then used to compare the read data to the data written to the DUTs at block 810. Any mismatches are either logged on memory module 420 or communicated by the instantiated FPGA block to the tester processor at block 812. The tester processor subsequently flags mismatches to the system controller at block 814 after receiving the error log.

II D) Hardware Accelerator Packet Builder Mode (FA Mode)

Figure 9:
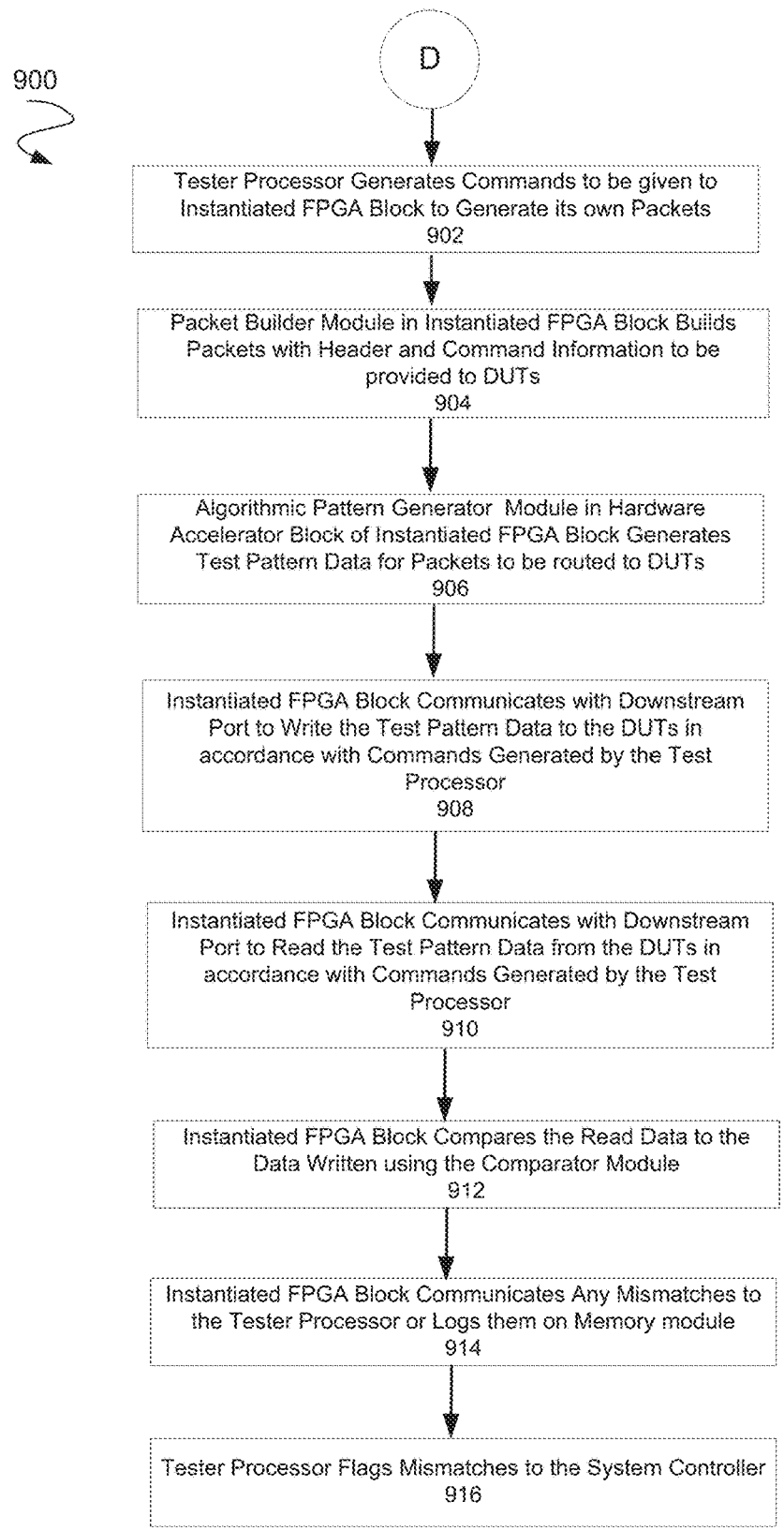
FIG. 9 is a continuation of FIG. 5 and is a flow chart of an exemplary method of testing DUTs in the hardware accelerator packet builder mode in one embodiment of the present invention.

FIG. 9 depicts a flowchart 900 of an exemplary process of testing DUTs in the hardware accelerator packet builder mode according to an embodiment of the present invention. The invention, however, is not limited to the description provided by flowchart 900. Rather, it will be apparent to persons skilled in the relevant art(s) from the teachings provided herein that other functional flows are within the scope and spirit of the present invention.

Flowchart 900 will be described with continued reference to exemplary embodiments described above in reference to FIGS. 2, 3 and 4, though the method is not limited to those embodiments Referring now to FIG. 9, a method of hardware acceleration is shown wherein the FPGA devices share both data and command generation functionality so as to relieve the processing load on the tester processor 304 and the data load on system buses 330 and 332. This mode is also known as "full acceleration" (FA) mode because most of the control for running the device tests is shifted to the FPGA devices and the tester processor 304 retains control for only commands other than reads and writes and compares.

At block 902 of the hardware accelerator packet builder mode, the tester processor 304 generates commands to be communicated to the instantiated FPGA block 410 to generate its own packets. The tester processor, in one implementation, retains functionality for only the non read/write/compare commands in this mode. The functionality for commands such as read, write and compare operations are conveyed to the instantiated FPGA blocks. At block 904, the packet builder module 445 of the instantiated FPGA tester block builds packets with header and command information to be communicated to the DUTs. The packets comprise at least the command type, the block address of the device and the test pattern data.

The algorithmic pattern generator module 443 within the hardware accelerator block 440 generates the pseudo random test data to be written to the DUTs at block 906. The logic block module 450 comprises functionality for routing the data and commands generated by the instantiated FPGA block and consolidating them into packets to be written out to the DUTs.

At block 908, the instantiated FPGA tester block communicates with the downstream port 480 to route the test pattern data to the DUTs. The instantiated FPGA block 410, at step 910, communicates with the downstream port to read the test pattern data from the DUTs. The comparator module 446 of the hardware accelerator block 440 is then used to compare the read data to the data written to the DUTs at block 912. Any mismatches are either logged on memory module 420 or communicated by the instantiated FPGA block to the tester processor at block 914. The tester processor subsequently flags mismatches to the system controller at block 916 after receiving the error log.

Note that in the FA mode, the software on the tester processor 304 configures the firmware (including the FPGA) to generate both commands (e.g., pertaining to read, write and compare operations) and data for block transfers to the DUT. The FPGA generates both the commands and the data and uses, for example, the packet builder module 445 (from FIG. 4) to create packets comprising the command and data information to transmit to the DUTs. The firmware (e.g., logic block 450) tracks and manages the commands in this mode instead of the tester processor 304. In one embodiment, the DUTs transfers the data that is read from it to the FPGA (e.g., to the local memory module 420 or to the comparator module 446 shown in FIG. 4). In response to the data transfer from the DUT, the FPGA block 410 may take one of several actions including, for example, invoking the comparator module 446 of the hardware accelerator block 440 to compare the data read from the DUTs to the data written to the DUTs.

II E) Software Directed Firmware Acceleration Mode (the FA-LITE Mode)

As discussed above, in one embodiment, the tester comprises a software directed firmware acceleration mode (also referred to as FA-LITE mode) in which the commands (e.g., commands to perform a block transfer of data) are generated by the tester processor 304 (similar to the PIDA mode). However, unlike the PIDA mode where the commands are communicated directly to the DUTs from the tester processor 304, the commands generated by the tester processor 304 are placed in a FIFO queue, which feeds the commands to the firmware (e.g., the packet builder module 445 in the FPGA). This allows the commands to be queued up in a buffer and be readily available for consumption by the FPGA (e.g., FPGA 1011A) as bandwidth frees up in the DUTs to process more commands. When bandwidth frees up in the DUTs, the FPGA accesses the commands from the buffer. As a result, the firmware can operate at full speed without any interruptions including waiting for fresh commands from the tester processor 304. In other words, the FIFO queue, when storing new instructions for the FPGA can maintain the FPGA substantially always busy.

In one embodiment, for example, the tester processor sends commands to the FPGA that represent commands such as READ, WRITE, FLUSH, TRIM, etc. In one embodiment, the commands are transmitted from the processor to the FPGA in batch mode. Before sending the commands to the DUT, the FPGA formats the commands for the specific protocol(s) being used, e.g., PCIe, SATA, etc. The FPGA sends the commands to the DUT as resources become available in the DUT. The FPGA manages and tracks those commands until they are completed by the DUT.

By comparison, in bypass or PIDA mode, the processor sends the commands (e.g., READ, WRITE, FLUSH, TRIM, etc.) to the DUT. The FPGA merely acts as a conduit for the commands. The processor manages and tracks the commands until they are completed by the DUT in bypass or PIDA mode.

In one implementation, in software directed firmware acceleration mode, instead of transmitting commands to the FPGA, the tester processor 304 transmits instructions to the FIFO queue, where the instructions are held until the FPGA is ready to process them. The FPGA then translates the instructions into commands that can be processed by the FPGA and transmitted to the DUTs (e.g., read/write commands). The instructions are high-level directives to the FPGA to generate commands for the DUTs. In other words, in one implementation, the FPGA generates commands based on the instructions from the tester processor 304 that it receives through a FIFO queue (as will be explained in FIG. 10).

Figure 10:
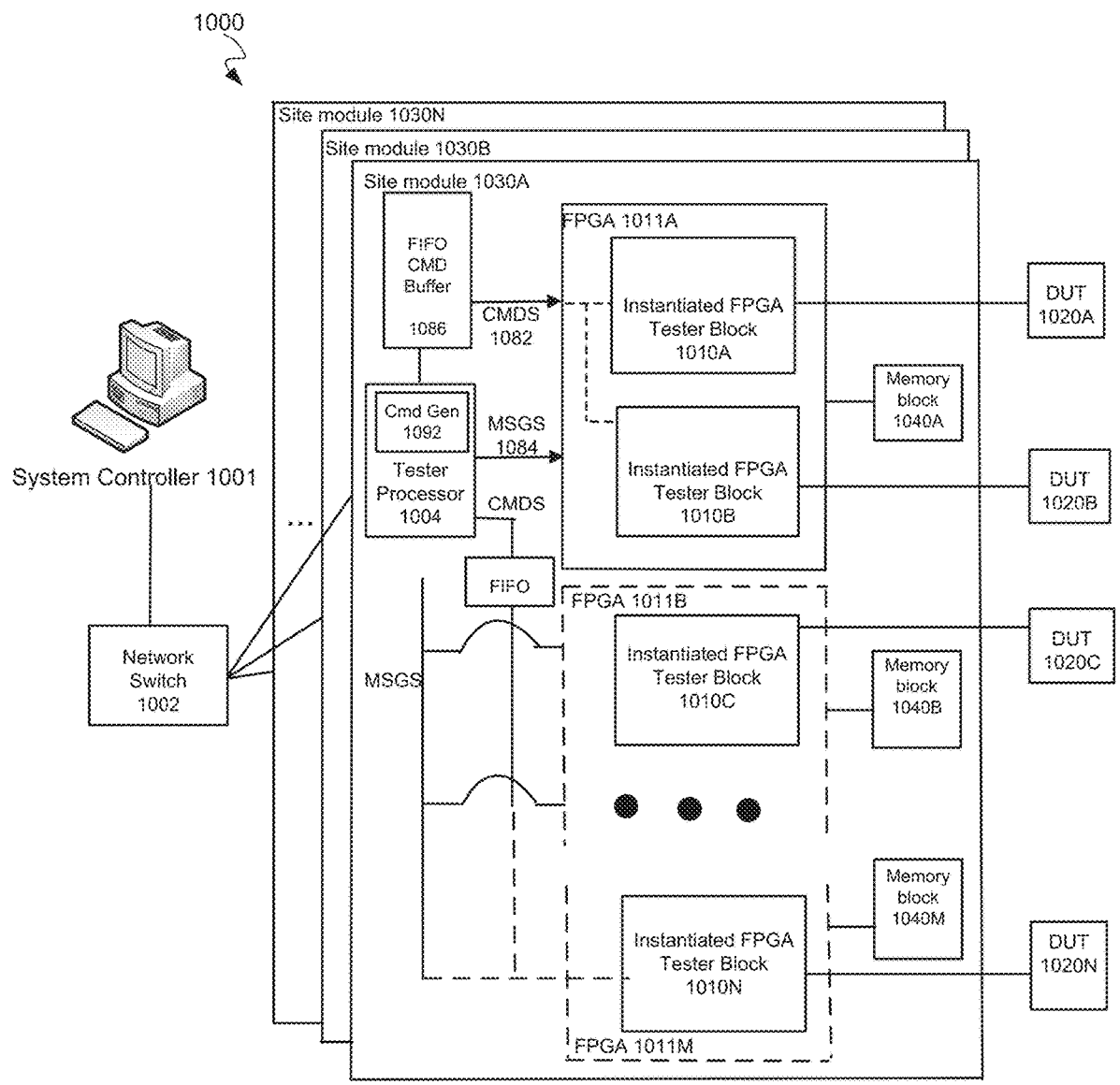
FIG. 10 is an exemplary high level block diagram of the automatic test equipment (ATE) apparatus 1000 implementing the software directed firmware acceleration mode in accordance with an embodiment of the present invention.

FIG. 10 is an exemplary high level block diagram of the automatic test equipment (ATE) apparatus 1000 implementing the software directed firmware acceleration mode in accordance with an embodiment of the present invention. In one embodiment, ATE apparatus 1000 is similar to ATE apparatus 1000 with a few exceptions. The ATE apparatus 1000, for example, comprises a FIFO queue 1086 wherein commands generated by tester processor 1004 (e.g., by command generation module 1092) are buffered and available for the FPGA 1011A to consume as more bandwidth is available in the DUTs. In other words, the FPGA 1011A buffers the incoming commands from the tester processor 1004 and transmits them to the DUTs as and when they are ready to accept more commands. As noted above, in one implementation, the FIFO queue 1086 may buffer instructions from the tester processor which are then translated into commands for the DUTs by the FPGA.

Note that in one embodiment, the command generation module 1092 of the tester processor 1004 generates the commands (or instructions) to be transmitted to the FIFO queue or buffer 1086. Compared to the FA mode (where the FPGA 1011A generates the commands), the command generation module 1092 in FA-LITE mode is implemented within the tester processor 1004.

The turnaround time for the commands is faster in the software directed firmware acceleration mode because the DUTs stay underutilized for shorter amounts of time compared to, for example, the PIDA mode (where the tester processor transmits the commands to the DUTs directly). As a result, more data can be transferred to the DUTs which advantageously results in bandwidth improvement.

Holding the commands in a FIFO queue 1086 where they are available to the FPGA to process when it frees up advantageously prevents the tester processor 1004 from acting as a bottleneck. Further, the software directed firmware acceleration mode increases testing throughput by offloading command generation tasks from the FPGA onto the tester processor and having the software (on the tester processor) perform most of the processing work for command generation. Generating commands consumes resources on the FPGA and offloading command generation capability onto the tester processor improves command flexibility.

While the tester processor generates commands efficiently, it may act as a bottleneck with respect to tracking and managing commands. By making the FPGA responsible for the tracking and managing of the commands, the software directed firmware acceleration mode advantageously prevents the tester processor from slowing down the rate at which commands are processed and sent out to the DUTs. Accordingly, the software directed firmware acceleration mode (FA-LITE mode) in addition to the hardware accelerator packet builder mode (the FA mode) achieves high throughput or bandwidth (e.g., the quantity of data that can be transferred over to the DUTs in a given period of time).

Note that the tester processor (not the FPGA) generates the commands in software directed firmware acceleration mode (FA-LITE mode), which allows the FPGA to focus on generating data and transmitting the commands to the DUTs. In this way, the FA-LITE mode (in addition to the PIDA mode) also provides high workload flexibility. In this mode of operation, the FPGA is mostly generating data and reading from or writing data to the DUT.

Note further that the FA mode has high throughput but may have low functional flexibility because the FPGA has to generate both the commands and data. On the other hand, typically, the PIDA mode has lower throughput (because the tester processor may act as a bottleneck) but has high workload flexibility because it offloads command generation onto the tester processor. By comparison, the FA-Lite mode not only increases functional flexibility (by offloading command generation to the tester processor) but increases performance by performing the managing and tracking of the commands in a way that does not keep the DUTs underutilized for protracted periods of time (and also maintains the FPGA as substantially always busy).

In one embodiment, in the FA-LITE mode, the software on the tester processor 304 configures the firmware (including the FPGA 1011A) to generate data for block transfers to the DUT. While the FPGA is configured to generate data for the DUTs, the commands are generated by the tester processor 304 and sent to the FIFO queue 1086 in the firmware (including FPGA 1011A). Note that unlike the PIDA mode where the commands are sent directly from the tester processor to the DUTs, the commands in the FA-LITE mode are transmitted to the firmware (e.g., a FIFO queue 1086 within the firmware). The FPGA tracks and manages the commands (instead of the tester processor) and consumes them from the FIFO queue as processing bandwidth becomes available to the FPGA.

The commands are then transmitted by the FPGA to the DUTs. In one embodiment, the DUTs transfers the data that is read from it to the FPGA (e.g., to the local memory module 420 or the comparator module 446 in FIG. 4). In response to the data transfer from the DUT, the FPGA 1011A may take one of several actions including, for example, invoking the comparator module 446 of the hardware accelerator block 440 (in FIG. 4) to compare the data read from the DUTs to the data written to the DUTs.

Note that ATE apparatus 1000 may be implemented within any testing system capable of testing multiple DUTs simultaneously. For example, in one embodiment, apparatus 1000 may be implemented inside a primitive as shown in FIG. 12.

Referring to FIG. 10, an ATE apparatus 1000 for testing semiconductor devices in software directed firmware acceleration mode includes a system controller 1001, a network switch 1002 connecting the system controller to the site module boards 1030A-1030N, FPGA devices 1011A-1011M comprising instantiated FPGA tester blocks 1010A-1010N, memory block modules 1040A-1040M wherein each of the memory blocks is connected to one of the FPGA devices 1011A-1011M, and the devices under test (DUTs) 1020A-1020N, wherein each device under test 1020A-1020N is connected to one of the instantiated FPGA tester blocks 1010A-1010N. It should be noted that the DUTs 1020A-1020N can, in one embodiment, be solid state drives (SSDs). In one embodiment, each of the FPGA devices 1011A-1011M is connected to its own dedicated memory block 1040A-1040M. These memory blocks can, among other things, be utilized to store the test pattern data that is written out to the DUTs.

In one embodiment, the system controller 1001 may be a computer system, e.g., a personal computer (PC) that provides a user interface for the user of the ATE to load the test programs and run tests for the DUTs connected to the ATE 1000 (similar to FIG. 10). In one embodiment, the system controller 1001 can be connected to the site module boards 1030A-1030N through a network switch, such as an Ethernet switch. In other embodiments, the network switch may be compatible with a different protocol such as TCP/IP, Fibre Channel, 802.11 or ATM, for instance.

In one embodiment, each of the site module boards 1030A-1030N may be a separate standalone board used for purposes of evaluation and development that attaches to custom-built load board fixtures, on which the DUTs 1020A-1020N are loaded, and also to the system controller 1001 from where the test programs are received. In other embodiments, the site module boards may be implemented as plug-in expansion cards or as daughter boards that plug into the chassis of the system controller 1001 directly. Alternatively, the site module boards may be housed within an enclosure of a primitive (as shown in FIG. 12) and may connect to the various DUTs using a device interface board (DIB).

The site module boards 1030A-1030N can each comprise at least one tester processor 1004 and at least one FPGA device (e.g. FPGA 1011A). In one embodiment, the tester processor and its associated memory may be located on a separate board (not shown) affixed to the respective site module. This separate board may be called a Computer On Module (or COM) board. In other words, the FPGA may be located on a separate site module board while the tester processor (with an associated memory) is located on a COM board.

The tester processor 1004 and the FPGA devices 1011A-1011M on the site module board run the test methods for each test case in accordance with the test program instructions received from the system controller 1001. In one embodiment, the tester processor 1004 controls the FPGA devices on the site module and the DUTs connected to the site module based on the test program received from the system controller. In the embodiment of FIG. 10, the tester processor 1004 generates commands and transmits them to a FIFO buffer 1086, wherein the commands are held in order until the FPGA is ready to process additional commands. When the FPGA 1011A determines that the DUTs are ready to process additional data and commands, the FPGA accesses the commands from FIFO buffer 1086 over signal bus 1082. Messages that do not comprise commands (e.g., administrative, setup, configuration, data messages to request and transfer data, etc.) are transmitted from the tester processor 304 over signal pathway 1084.

Figure 11:
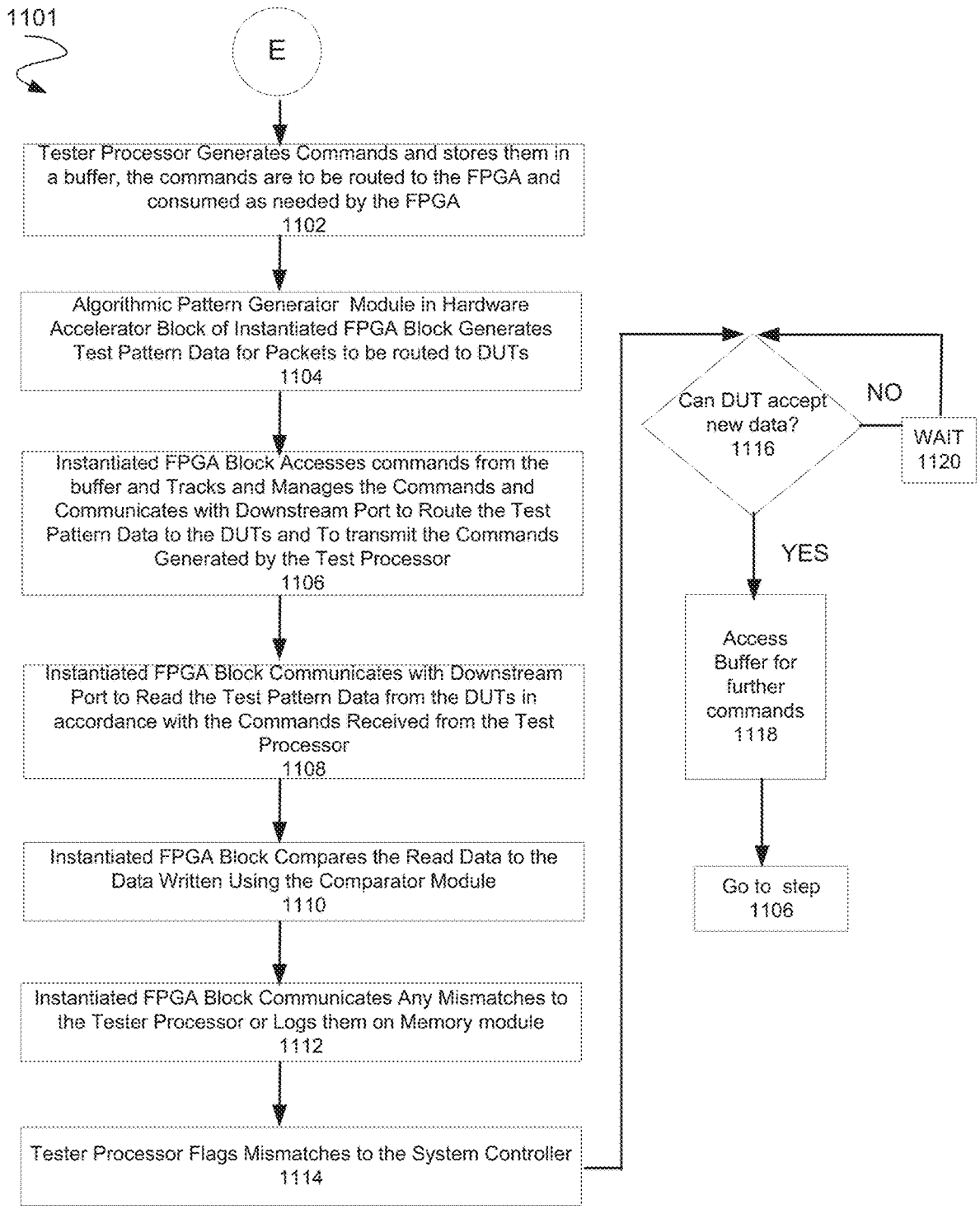
FIG. 11 depicts a flowchart of an exemplary process of testing DUTs in the software directed firmware acceleration mode according to an embodiment of the present invention.

FIG. 11 depicts a flowchart 1101 of an exemplary process of testing DUTs in the software directed firmware acceleration mode according to an embodiment of the present invention. The invention, however, is not limited to the description provided by flowchart 1101. Rather, it will be apparent to persons skilled in the relevant art(s) from the teachings provided herein that other functional flows are within the scope and spirit of the present invention.

Flowchart 1101 will be described with continued reference to exemplary embodiments described above in reference to FIGS. 2, 3, 4, and 10 though the method is not limited to those embodiments.

Referring now to FIG. 11, a method of hardware acceleration is shown wherein the FPGA devices comprise data generation functionality so as to relieve the processing load on the tester processor 304. At block 1102 of the software directed firmware acceleration mode, the tester processor 304 generates commands to be routed to the FPGA and stores them in a buffer (e.g., FIFO buffer 1086). As described above, the commands generated by the tester processor 304 are inserted into a FIFO command buffer 1086, and the FPGA accesses the commands from the FIFO buffer 1086 as bandwidth becomes available. In one implementation, the algorithmic pattern generator module 443 within the hardware accelerator block 440 generates the pseudo random test data to be written to the DUTs at block 1104. The logic block module 450 comprises functionality for managing and tracking the commands. Further, the logic block module 450 also comprise functionality for routing the data generated and adding it to the packets to be written out to the DUTs.

The mode is considered "hardware accelerated" because the functionality for generating data can be done much faster in hardware by the algorithmic pattern generator of the FPGA device than in software by the tester processor. Also, the "tester per DUT" architecture allows the DUT to be directly connected to its own dedicated instantiated FPGA tester block generating test pattern data for the DUT as shown in FIG. 4.

At block 1106, the instantiated FPGA block 410 accesses the commands from the FIFO buffer, and tracks and manages the commands generated by the tester processor. Further, the instantiated FPGA block 410 communicates with the downstream port 480 to route the test pattern data to the DUTs in accordance with the commands generated by the tester processor. The instantiated FPGA block 410, at block 1108, communicates with the downstream port to read the test pattern data from the DUTs in accordance with commands generated by the tester processor.

The comparator module 446 of the hardware accelerator block 440 is then used to compare the read data to the data written to the DUTs at block 1110. The APG module 443 is designed in a way such that the comparator module can perform read operations on it with the same parameters that were used to generate the pseudo-random data and receive the same data that was written to the DUTs at block 1104. The APG module 443 regenerates the data that was written to the DUTs on the fly and communicates it to the comparator module 446. Any mismatches are either logged on memory module 420 by the memory control module 444 or communicated by the instantiated FPGA block to the tester processor at block 1112. The tester processor subsequently flags mismatches to the system controller at block 1114 after receiving the error log.

At block 1116, a determination is made regarding whether the DUT connected to the FPGA can accept new data. If the DUT has available bandwidth, the buffer 1086 is accessed for further commands at block 1118. Note that new commands are being placed by the tester processor in buffer 1086 as process 1101 continues to be performed so that they are ready for the FPGA when availability frees up in a connected DUT. As the buffer is accessed for commands, the process return to block 1106. If the DUT is unable to accept new data, then the process waits and block 1120 before checking if DUTs have bandwidth again at block 1116.

The foregoing description, for purpose of explanation, has been described with reference to specific embodiments. However, the illustrative discussions above are not intended to be exhaustive or to limit the invention to the precise forms disclosed. Many modifications and variations are possible in view of the above teachings. The embodiments were chosen and described in order to best explain the principles of the invention and its practical applications, to thereby enable others skilled in the art to best utilize the invention and various embodiments with various modifications as may be suited to the particular use contemplated.

What is claimed is:

1. A system comprising:
   a first test board comprising a first FPGA; and
   a processor coupled to the first FPGA, wherein the first FPGA comprises a first core programmed to implement a communication protocol, and further wherein the first FPGA is programmed with at least one hardware accelerator circuit operable to internally generate commands and data for testing a device under test (DUT), wherein the processor is configured to operate in one of a plurality of functional modes, wherein each functional mode is configured to allocate functionality for generating commands and for generating data between the processor and the first FPGA in a different manner.

2. The system of claim 1, further comprising a second test board comprising a second FPGA and communicatively coupled to the first test board, wherein the second FPGA comprises a second core programmed to implement another communication protocol for the DUT.

3. The system of claim 2, wherein the second FPGA is further programmed to simulate the DUT.

4. The system of claim 3, wherein the first FPGA is operable to communicate with the second FPGA to test a communication link between the first test board and the second test board.

5. The system of claim 4, wherein the second FPGA is communicatively coupled with a memory module on the second test board, and wherein a test pattern for testing the communication link is stored on the memory module.

6. The system of claim 2, wherein the processor is operable to generate commands for coordinating a test sequence between the first FPGA and the second FPGA.

7. The system of claim 2, wherein the second core is programmed to implement a protocol for a PCie 4.0 solid state device (SSD) DUT.

8. The system of claim 2, wherein the second core is programmed to implement a protocol for a SATA DUT.

9. The system of claim 2, wherein the first test board and second test board have analogous hardware and layout designs.

10. The system of claim 2, wherein the second FPGA comprises an algorithmic pattern generator configured to automatically generate patterns in accordance with the another communication protocol programmed into the second core.

11. The system of claim 1, wherein the first core is programmed with a PCie protocol.

12. The system of claim 1, wherein the first test board is operable to connect to an interface board via a PCie connector.

13. A method of testing a device under test (DUT), the method comprising:
    executing a communication protocol using a first core of a first FPGA coupled to a processor, wherein the first FPGA is programmed with a hardware accelerator circuit, and wherein the processor is configured to operate in one of a plurality of functional modes;
    generating commands and data for testing a DUT using the hardware accelerator circuit; and
    allocating functionality for generating commands and for generating data between the processor and the first FPGA in a manner determined according to one of the plurality of functional modes to test the DUT.

14. The method of claim 13, further comprising generating commands for coordinating a test sequence between the first FPGA and a second FPGA communicatively coupled to the first FPGA using a controller coupled to the processor.

15. The method of claim 14, wherein a second core of the second FPGA is programmed to implement a protocol for a PCie 4.0 solid state device (SSD) DUT.

16. The method of claim 14, wherein a second core of the second FPGA is programmed to implement another communication protocol, wherein the second FPGA comprises an algorithmic pattern generator configured to automatically generate patterns in accordance with the another communication protocol programmed into the second core.

* * * * *